(12) United States Patent
Chuang et al.

(10) Patent No.: US 11,574,909 B2
(45) Date of Patent: Feb. 7, 2023

(54) SEMICONDUCTOR DEVICE, METHOD FOR MANUFACTURING THE SAME, AND INTEGRATED CIRCUIT

(71) Applicant: TAIWAN SEMICONDUCTOR MANUFACTURING COMPANY, LTD., Hsinchu (TW)

(72) Inventors: Ming-Yen Chuang, Hsinchu (TW); Katherine H. Chiang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/332,536

(22) Filed: May 27, 2021

(65) Prior Publication Data
US 2022/0384447 A1 Dec. 1, 2022

(51) Int. Cl.
*H01L 27/108* (2006.01)

(52) U.S. Cl.
CPC .. *H01L 27/10805* (2013.01); *H01L 27/10847* (2013.01)

(58) Field of Classification Search
None
See application file for complete search history.

(56) References Cited

U.S. PATENT DOCUMENTS

2013/0043455 A1* 2/2013 Bateman ............. H01L 45/1226
257/5

* cited by examiner

*Primary Examiner* — Anthony Ho
*Assistant Examiner* — Kevin Quinto
(74) *Attorney, Agent, or Firm* — Birch, Stewart, Kolasch & Birch, LLP

(57) ABSTRACT

A semiconductor device includes a transistor, a bit line and a bit-line via structure. The transistor is located in a transistor layer, and has a source contact and a drain contact. The bit line is electrically connected to one of the source contact and the drain contact. The bit-line via structure is located in the transistor layer, and electrically interconnects the bit line and a periphery device.

20 Claims, 27 Drawing Sheets

SEMICONDUCTOR DEVICE, METHOD FOR MANUFACTURING THE SAME, AND INTEGRATED CIRCUIT

BACKGROUND

Fabrication of memory, such as dynamic random-access memory, is not compatible with the fabrication of logic devices. Therefore, memory and logic devices are usually fabricated separately, and extra processes are required to combine them together during chip packaging, increasing manufacturing cost and chip size. Besides, the scheme of the separate memory and logic devices results in lower operating speed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
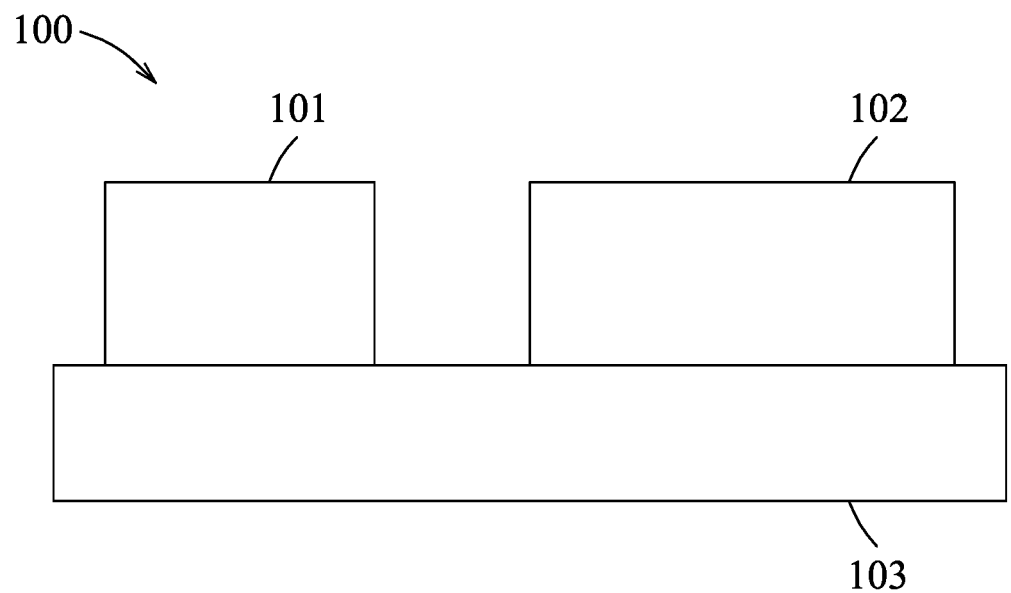
FIG. 1 is a schematic cross-sectional view illustrating an example of an integrated circuit.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "underneath," "right," "under," "rightmost," "beside," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to a semiconductor device, a method for manufacturing the same, and an integrated circuit. Especially, embodiments also include a semiconductor device located in the back-end-of-line (BEOL). The semiconductor device may be used in, for example, but not limited to, a 16 nanometer (N16) generation device, a 7 nanometer (N7) generation device, a 5 nanometer (N5) generation device, or other generation devices.

The disclosure relates to a memory design with special fabrication processes to achieve a complementary metal-oxide-semiconductor (CMOS) under array (CuA) scheme. The disclosure may be applied in all memory industries, particularly for high density memory, such as dynamic random-access memory (DRAM).

Figure 2:
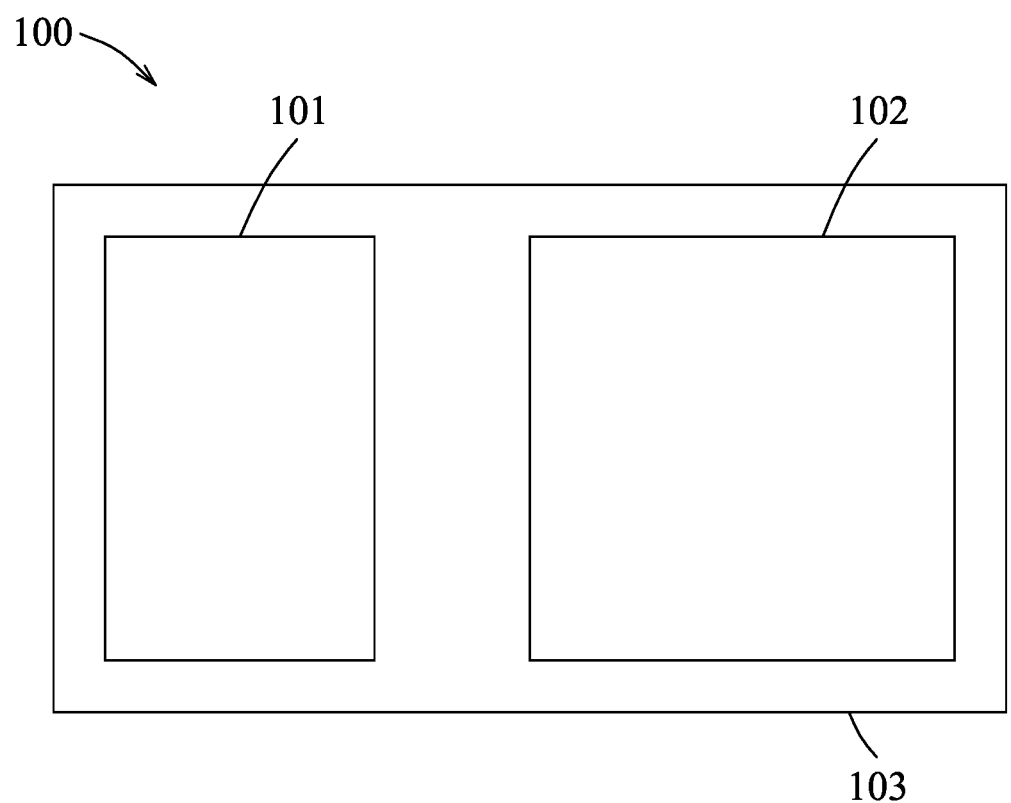
FIG. 2 is a top view of the example of the integrated circuit.

FIG. 1 illustrates a schematic cross-sectional view of an example of an integrated circuit 100 where extra processes are used to combine a logic chip 101 and a memory array 102 that are separated from each other on a substrate 103. FIG. 2 illustrates a top view of the example of the integrated circuit 100. Because of the separate arrangement of the logic chip 101 and the memory 102, shrinkage of an area of the integrated circuit 100 may be challenging.

Figure 3:
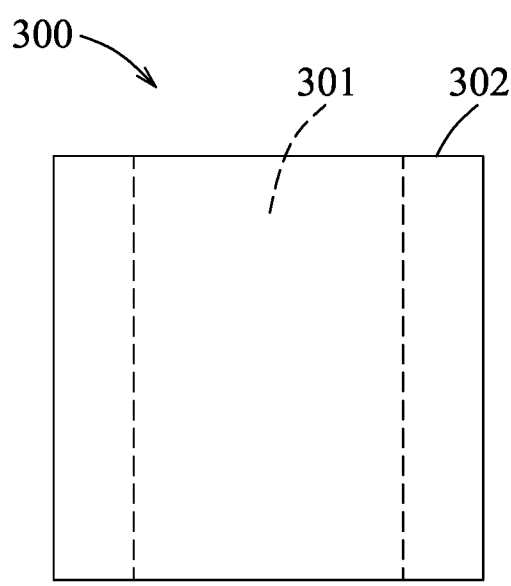
FIG. 3 is a top view of an integrated circuit in accordance with some embodiments.

FIG. 3 illustrates a top view of an integrated circuit 300 in accordance with some embodiments. The integrated circuit 300 includes a logic chip 301 and a memory array 302 similar to the logic chip 101 and the memory array 102 shown in FIGS. 1 and 2, but the integrated circuit 300 adopts the CuA scheme where the logic chip 301 and the memory array 302 are stacked up.

Figure 4:
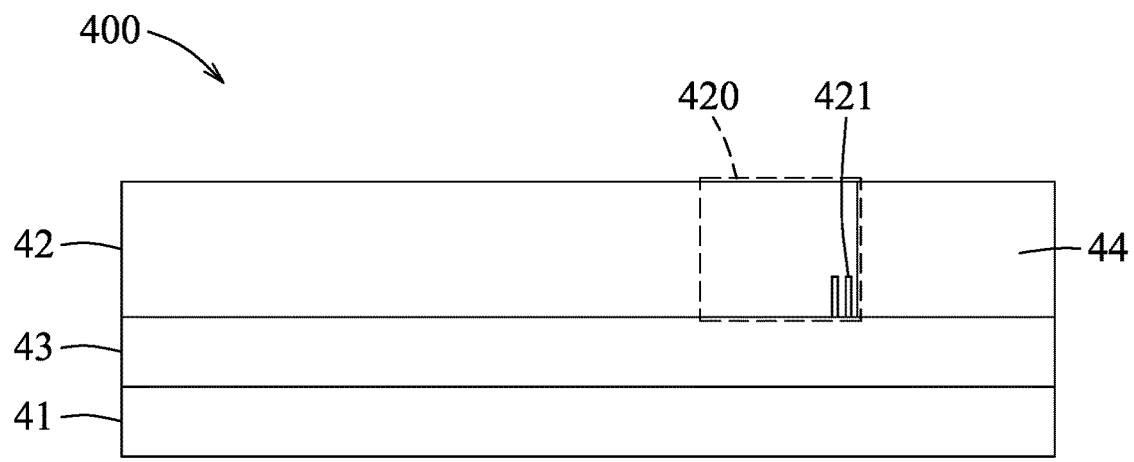
FIG. 4 is a schematic cross-sectional view of an integrated circuit in accordance with some embodiments.

FIG. 4 illustrates a schematic cross-sectional view of an integrated circuit 400 in accordance with some embodiments. The integrated circuit 400 is similar to the integrated circuit 300 shown in FIG. 3. The integrated circuit 400 may include at least one logic device 41 in the front-end-of-line (FEOL) and a memory array 42 in the BEOL. In some embodiments, the memory array 42 may include a region 420 that is formed with a bit-line via structure 421 that connects bit lines (not shown) of the memory array 42 to the logic device 41 in the FEOL. In some embodiments, the region 420 may be allocated for dummy cells. In some embodiments, the bit-line via structure 421 connects the bit lines to the logic device 41 in the FEOL via a routing structure 43 in the BEOL. In some embodiments, the integrated circuit 400 further includes another routing structure 44 beside the memory array 42 in the BEOL.

Figure 5:
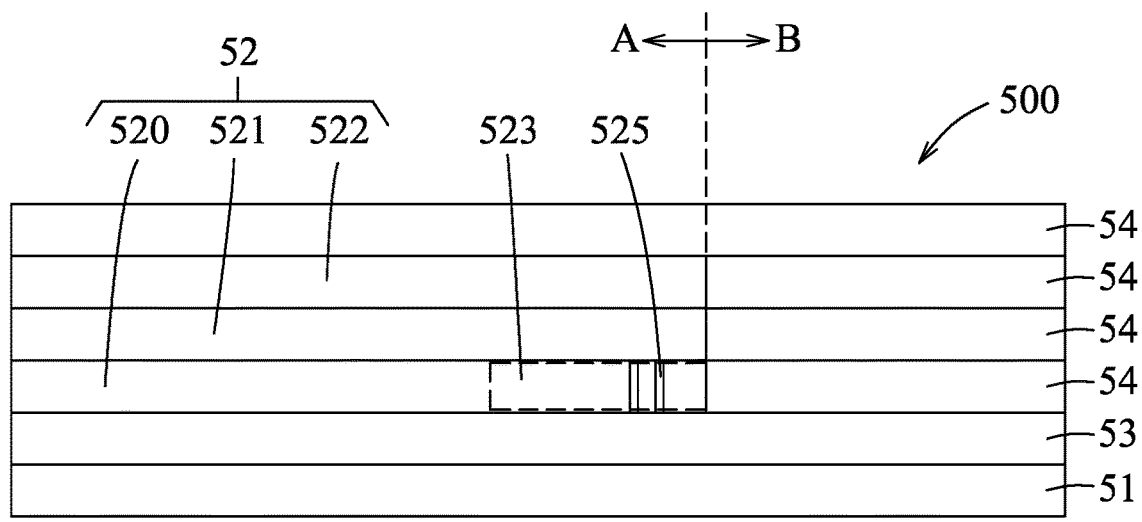
FIG. 5 is a schematic cross-sectional view of an integrated circuit in accordance with some embodiments.

FIG. 5 illustrates a schematic cross-sectional view of an integrated circuit 500 in accordance with some embodiments. The integrated circuit 500 is similar to the integrated circuit 400 shown in FIG. 4. The integrated circuit 500 may include at least one logic device 51 in the FEOL and a memory array 52 in the BEOL. In some embodiments, the memory array 52 may be implemented as a 1T1C (one transistor one capacitor) BEOL DRAM, and may include a transistor layer 520, a bit-line layer 521 stacked on the transistor layer 520, and a capacitance layer 522 stacked on the bit-line layer 521. The bit-line layer 521 may include a plurality of bit lines (not shown). The capacitance layer 522 may include a plurality of capacitors (not shown). The transistor layer 520 is formed with a bit-line via structure 525 that connects the bit lines in the bit-line layer 521 to the logic device 51 in the FEOL via a routing structure 53 in the BEOL. The routing structure 53 may be formed in a metal layer in the BEOL for connecting to the logic device 51. Accordingly, the memory array 52 may be connected with a periphery device (e.g., the logic device 51) via the bit-line via structure 525. In some embodiments, the memory array 52 may include a plurality of storage cells, which may be divided into active cells and dummy cells. The bit-line via structure 525 may be formed in a portion 523 of the transistor layer 520 that belongs to a region allocated for the dummy cells. The integrated circuit 500 further includes other routing structures 54 in the BEOL. In some embodiments, the integrated circuit 500 may have an array area (A) where the memory array 52 is disposed, and an open area (B) where some of the other routing structures 54 are disposed.

Figure 6:
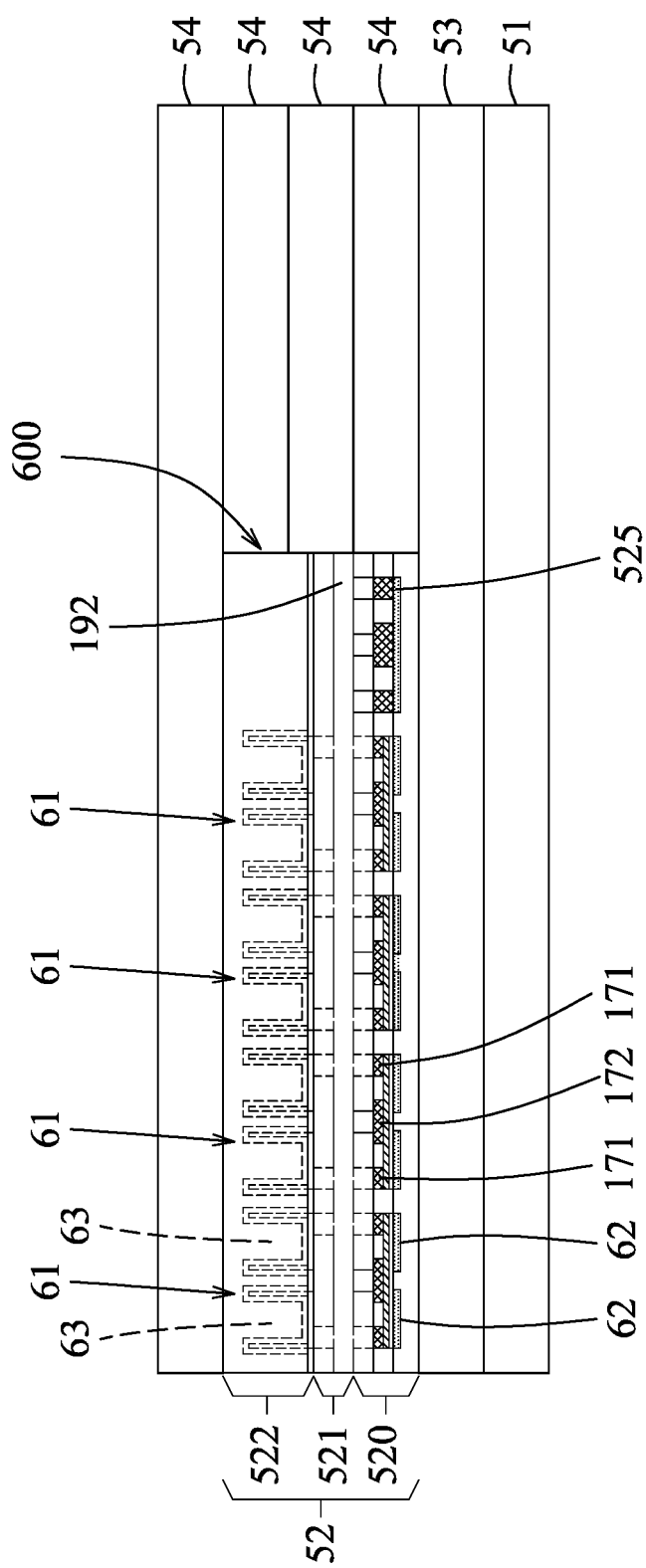
FIG. 6 is a schematic cross-sectional view of a semiconductor device included in an integrated circuit in accordance with some embodiments.

FIG. 6 illustrates a schematic cross-sectional view showing a semiconductor device 600 in accordance with some embodiments in an integrated circuit, where the semiconductor device 600 may serve as a memory array similar to the memory array 52 shown in FIG. 5. It is noted that four storage cells 61 are illustrated in FIG. 6, but the actual number of the storage cells 61 is not limited to the disclosure herein. Each of the storage cells 61 may include two back-end transistors 62 in the transistor layer 520 and two capacitors 63 in the capacitance layer 522. In some embodiments, the two back-end transistors 62 of each of the storage cells 61 may have a common drain contact 172 and two source contacts 171, and the bit-line via structure 525 is located to the right of the storage cells 61, in the transistor layer 520 and under a bit line 192 in the bit-line layer 521. For each of the storage cells 61, the source contacts 171 may be electrically and respectively connected to the two capacitors 63, and the common drain contact 172 may be electrically connected to the logic device 51 through the bit line 192 and the bit-line via structure 525. In some embodiments, the rightmost storage cell 61 may be a dummy cell and the other storage cells 61 may be active cells. In other embodiments, it may be that all of the storage cells 61 are active cells and no dummy cell is included in the semiconductor device 600.

Figure 7:
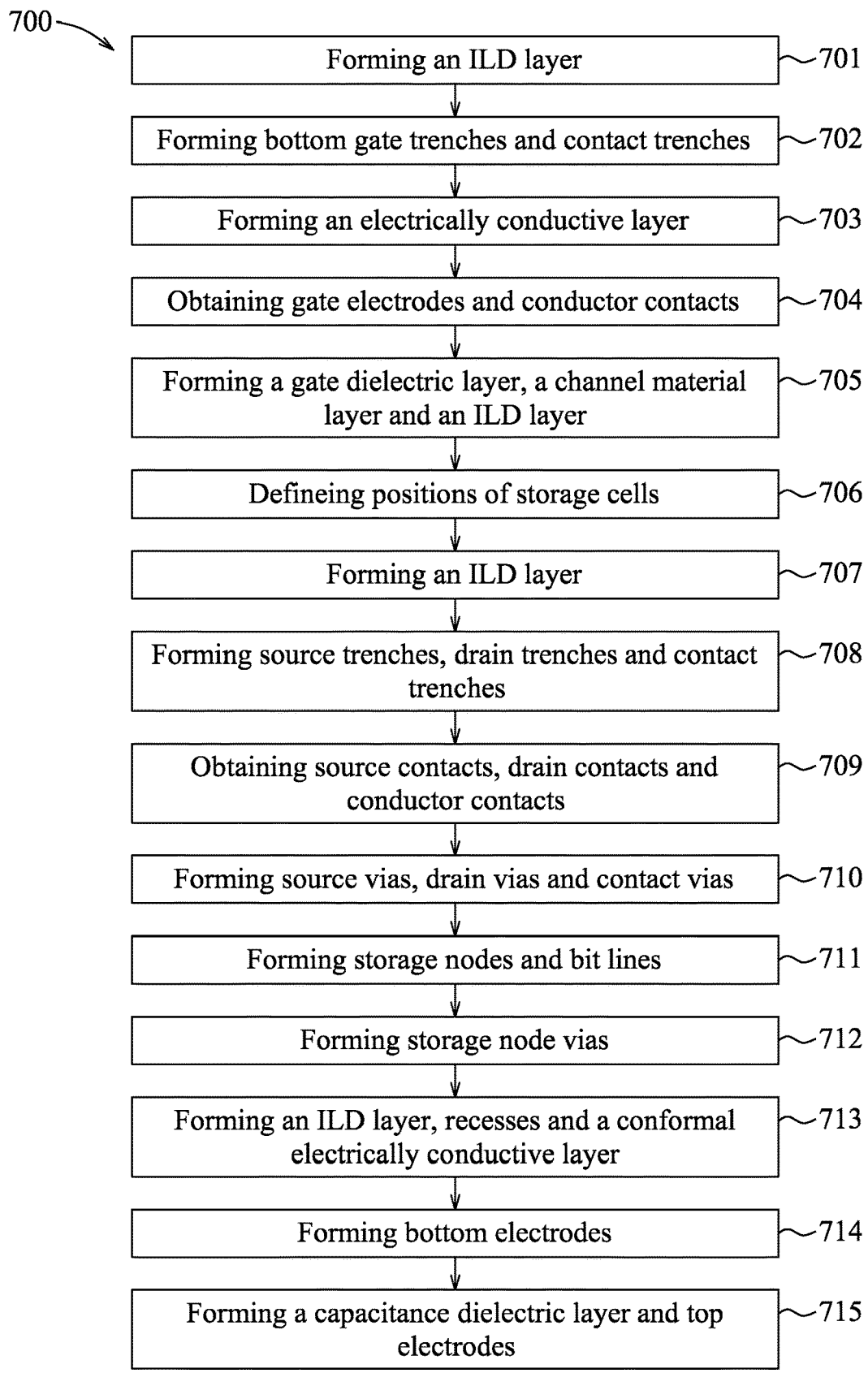
FIG. 7 is a flow diagram illustrating a method for manufacturing a semiconductor device (a portion of the integrated circuit of FIG. 6) in accordance with some embodiments.

FIG. 7 is a flow diagram illustrating a method 700 for manufacturing a semiconductor device (see FIG. 36, which may be a part of the semiconductor device 600 shown in FIG. 6) in accordance with some embodiments. FIGS. 8 to 36 illustrate schematic views of the intermediate stages of the method 700.

Figure 8:
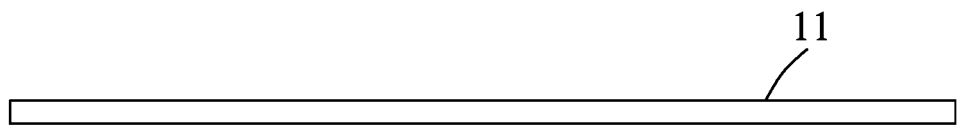
FIGS. 8 to 37 are schematic views illustrating intermediate stages of a method for manufacturing the semiconductor device in accordance with some embodiments as depicted in FIG. 7.
Figure 9:
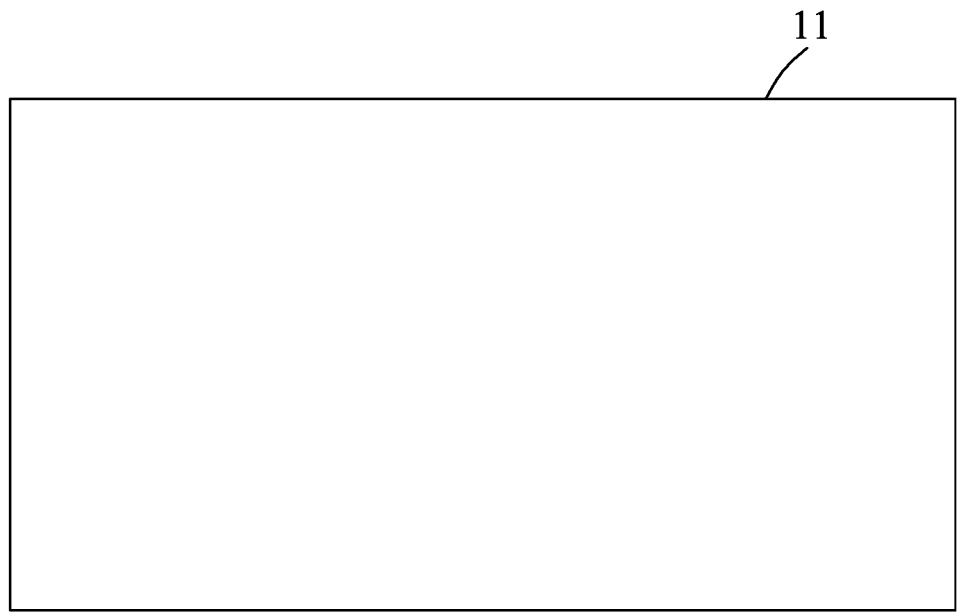

Referring to FIGS. 7, 8 and 9, the method 700 begins at step 701, where an interlayer dielectric (ILD) layer 11 is formed. FIG. 9 is a top view of FIG. 8. In some embodiments, the ILD layer 11 may be formed on the routing structure 53 (see FIG. 5). Step 701 may be implemented by depositing a dielectric layer (not shown) using, for example, but not limited to, chemical vapor deposition (CVD), physical vapor deposition (PVD), sputtering, combinations thereof, or other suitable techniques. In some embodiments, the ILD layer 11 may be a single material layer. In alternative embodiments, the ILD layer 11 may be constituted by multiple films with different materials. In some embodiments, the ILD layer 11 may include, but not limited to, polyimide, epoxy resin, acrylic resin, phenol resin, benzocyclobutene (BCB), polybenzooxazole (PBO), other suitable polymer-based dielectric materials, or combinations thereof. In alternative embodiments, the ILD layer 11 may include silicon oxide, silicon oxynitride, or combinations thereof. Other suitable dielectric materials are within the contemplated scope of the present disclosure.

Figure 10:
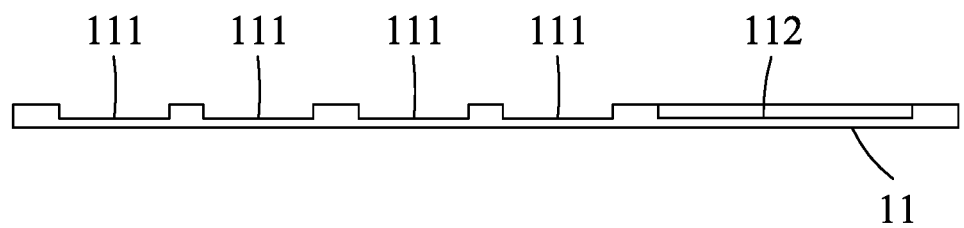
Figure 11:
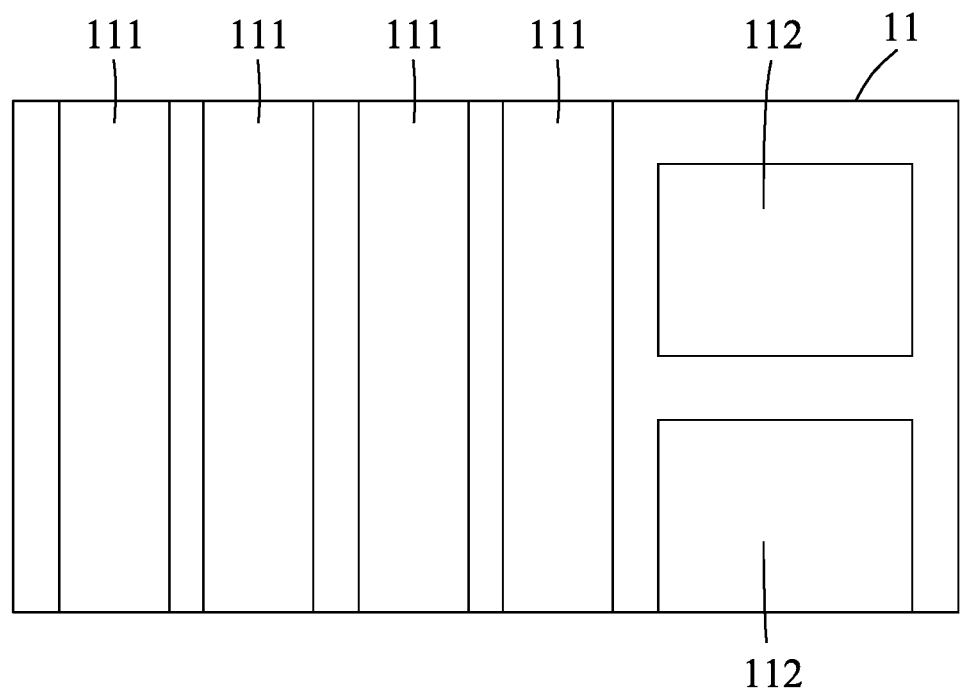

Referring to FIGS. 7, 10 and 11, the method 700 proceeds to step 702, where a patterning process is conducted to pattern the ILD layer 11 shown in FIGS. 8 and 9 so as to form bottom gate trenches 111 and contact trenches 112 in the ILD layer 11. FIG. 11 is a top view of FIG. 10. In the example depicted in FIGS. 10 and 11, it is exemplified that there are four bottom gate trenches 111 and two contact trenches 112 in the ILD layer 11. Step 702 may be implemented using a photolithography process and an etching process. The photolithography process may include, for example, but not limited to, coating a photoresist, soft-baking, exposing the photoresist through a photomask, post-exposure baking, and developing the photoresist, followed by hard-baking, so as to form a patterned photoresist. The etching process may be implemented by etching the ILD layer 11 shown in FIGS. 8 and 9 through the patterned photoresist using, for example, but not limited to, a dry etching process, a wet etching process, other suitable processes, or combinations thereof.

Figure 12:
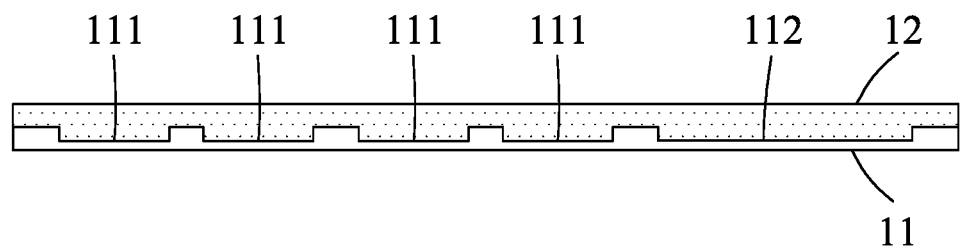
Figure 13:
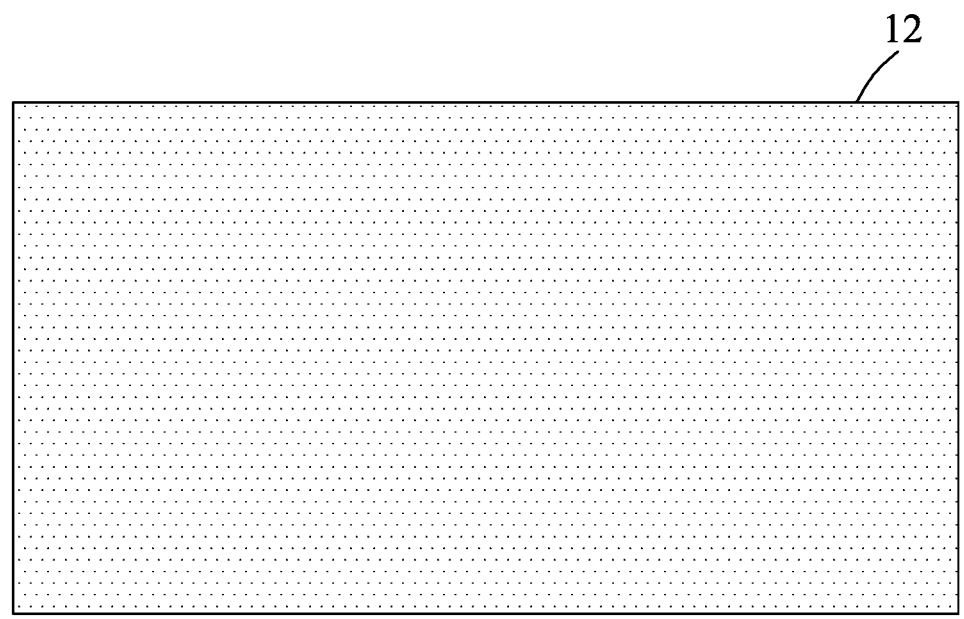

Referring to FIGS. 7, 12 and 13, the method 700 proceeds to step 703, where an electrically conductive layer 12 is formed. FIG. 13 is a top view of FIG. 12. In some embodiments, the electrically conductive layer 12 may be formed on the ILD layer 11 and fill the bottom gate trenches 111 and the contact trenches 112. The electrically conductive layer 12 may include a metallic material, a metal compound, polycrystalline silicon, or doped silicon. Other suitable conductive materials are within the contemplated scope of the present disclosure. The metallic material may include, for example, but not limited to, silver, aluminum, copper, tungsten, nickel, other suitable materials, alloys thereof, or combinations thereof. The metal compound may include, for example, but not limited to, titanium nitride, tantalum nitride, metal silicide, other suitable materials, or combinations thereof. The electrically conductive layer 12 may be deposited by, for example, but not limited to, CVD, PVD, sputtering, plating, combinations thereof, or other suitable techniques.

Figure 14:
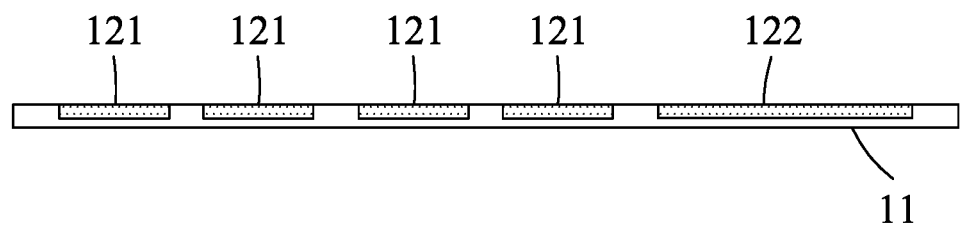
Figure 15:
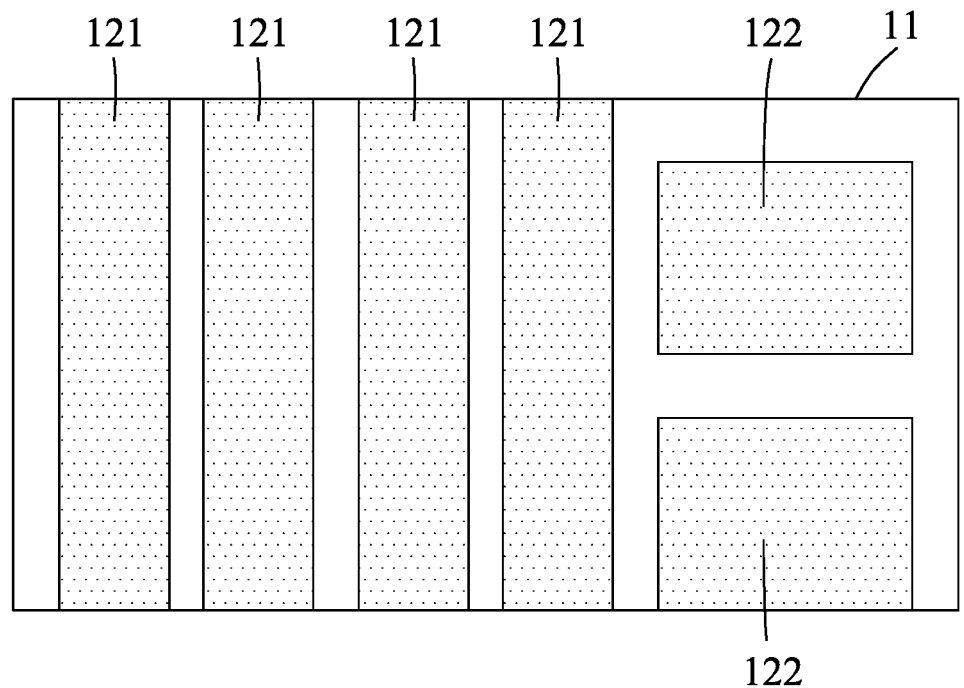

Referring to FIGS. 7, 14 and 15, the method 700 proceeds to step 704, where a planarization process is conducted to remove the excess of the electrically conductive layer 12 on the ILD layer 11 outside the bottom gate trenches 111 and the contact trenches 112 shown in FIGS. 12 and 13, so as to obtain four gate electrodes 121 and two conductor contacts 122. FIG. 15 is a top view of FIG. 14. The gate electrodes 121 and the conductor contacts 122 are disposed above the ILD layer 11, and are spaced apart from each other. Step 704 may be implemented using a chemical mechanical polishing (CMP) process or other suitable techniques. In some embodiments, top surfaces of the conductor contact 122 may be coplanar with top surfaces of the gate electrodes 121.

Figure 16:
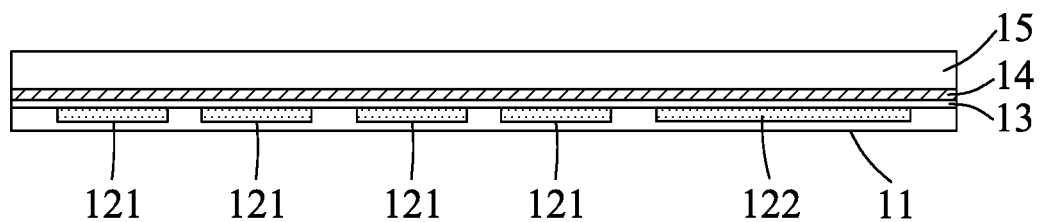
Figure 17:

Referring to FIGS. 7, 16 and 17, the method 700 proceeds to step 705, where a gate dielectric layer 13, a channel material layer 14 and an ILD layer 15 are formed in sequence. FIG. 17 is a top view of FIG. 16. The gate dielectric layer 13 is formed on the ILD layer 11, the gate electrodes 121 and the conductor contacts 122. The channel material layer 14 is formed on the gate dielectric layer 13. The ILD layer 15 is formed on the channel material layer 14.

The gate dielectric layer 13 may include, but not limited to, silicon oxide, silicon nitride, silicon oxynitride, hafnium oxide ($HfO_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), zirconium silicate, zirconium aluminate, zirconium oxide, titanium oxide, aluminum oxide ($Al_2O_3$), a hafnium dioxide-alumina ($HfO_2$—$Al_2O_3$) alloy, or combinations thereof. Other suitable gate dielectric materials are within the contemplated scope of the present disclosure. The gate dielectric layer 13 may be deposited by, for example, but not limited to, sputtering, CVD, PVD, atomic layer deposition (ALD), plasma-enhanced ALD, molecular beam epitaxy (MBE), combinations thereof, or other suitable techniques. In some embodiments, the gate dielectric layer 13 may be constructed in a single-layer form. In alternative embodiments, the gate dielectric layer 13 may include a plurality of films of different materials.

The channel material layer 14 includes an oxide semiconductor material, for example, but not limited to, indium gallium zinc oxide (InGaZnO, IGZO), tungsten-doped indium oxide (InWO), indium zinc oxide (InZnO), indium tin oxide (InSnO), gallium oxide ($GaO_x$), indium oxide ($InO_x$) or the like. In some embodiments, the channel material layer 14 may further include amorphous silicon, crystalline silicon, or the like. Other suitable channel materials are within the contemplated scope of the present disclosure. Formation of the channel material layer 14 in step 705 may be implemented using CVD, PVD, ALD, plasma-enhanced CVD (PECVD), epitaxial growth, or other suitable techniques. In some embodiments, the channel material layer 14 may be constructed in a single-layer form. In alternative embodiments, the channel material layer 14 may include a plurality of films of different materials.

The materials and the formation for the ILD layer 15 are similar to those for the ILD layer 11 described in step 701.

Figure 18:
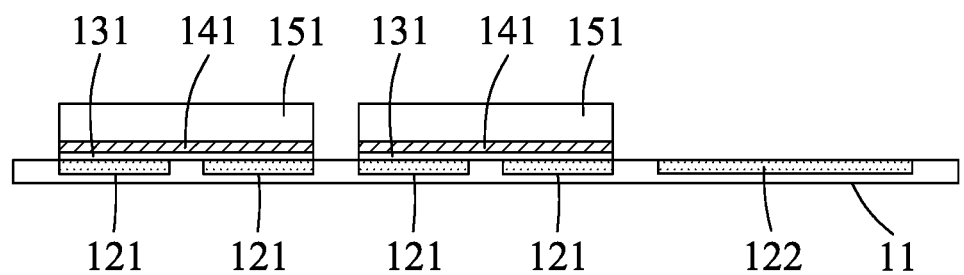
Figure 19:
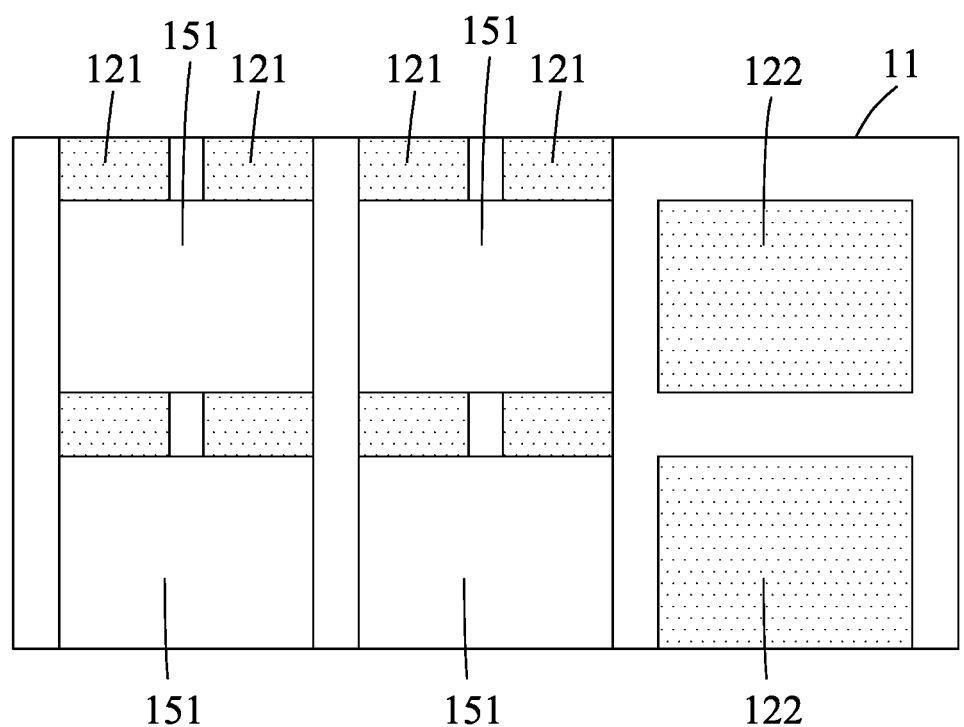

Referring to FIGS. 7, 18 and 19, the method 700 proceeds to step 706, where a patterning process is conducted to pattern the gate dielectric layer 13, the channel material layer 14 and the ILD layer 15 shown in FIGS. 16 and 17, so as to define positions of the storage cells 61 for the memory array 52 (see FIGS. 5 and 6) and to remove the gate dielectric layer 13, the channel material layer 14 and the ILD layer 15 above the conductor contacts 122 to expose the conductor contacts 122. FIG. 19 is a top view of FIG. 18. The patterning process may be implemented in a manner similar to step 702 described above, and the details thereof are omitted for the sake of brevity. After step 706, (i) the gate dielectric layer 13 is patterned into gate dielectric portions 131 each of which is formed over two adjacent ones of the gate electrodes 121 for a corresponding one of the storage cells 61, (ii) the channel material layer 14 is patterned into channel portions 141 each of which is formed over a corresponding one of the gate dielectric portions 131, and (iii) the ILD layer 15 is patterned to form ILD portions 151 each of which is formed over a corresponding one of the channel portions 141.

Figure 20:
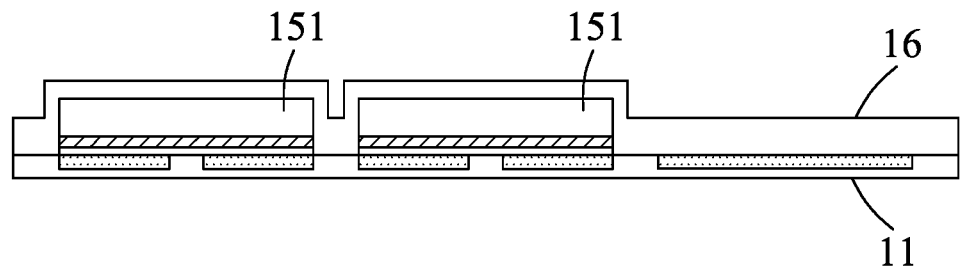
Figure 21:
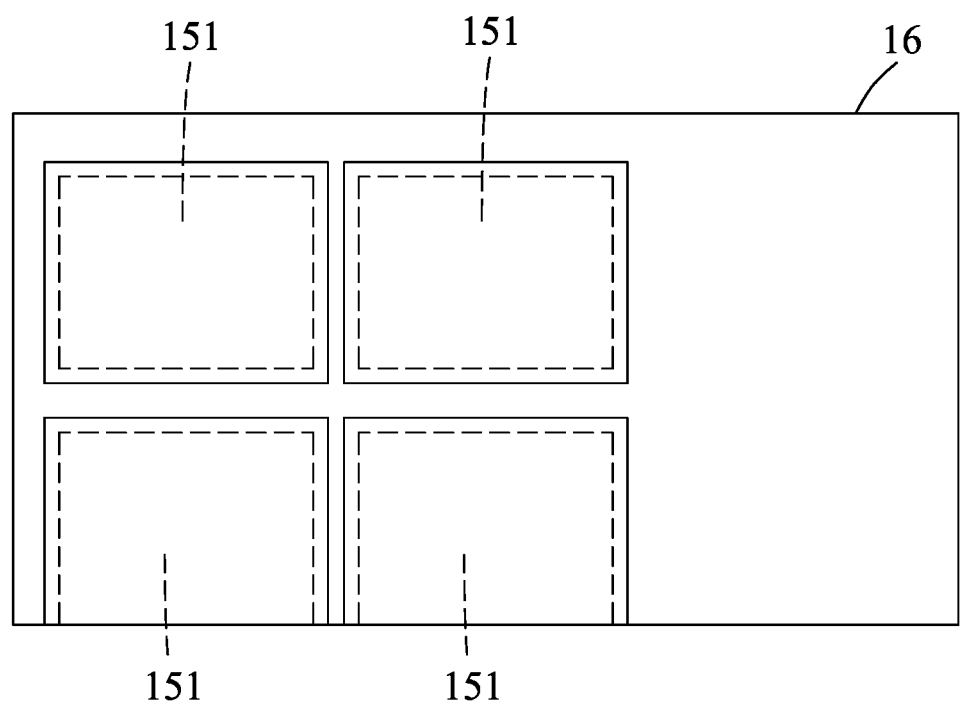

Referring to FIGS. 7, 20 and 21, the method 700 proceeds to step 707, where an ILD layer 16 is conformally formed over the structure shown in FIGS. 18 and 19 obtained in step 706. FIG. 21 is a top view of FIG. 20. The materials and the formation for the ILD layer 16 are similar to those for the ILD layer 11 described in step 701.

Figure 22:
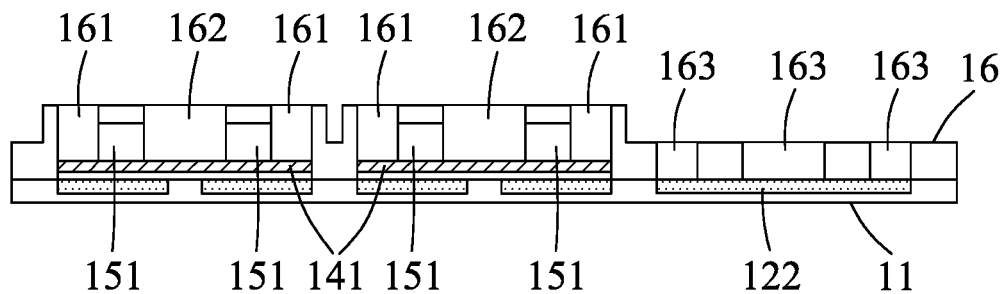
Figure 23:
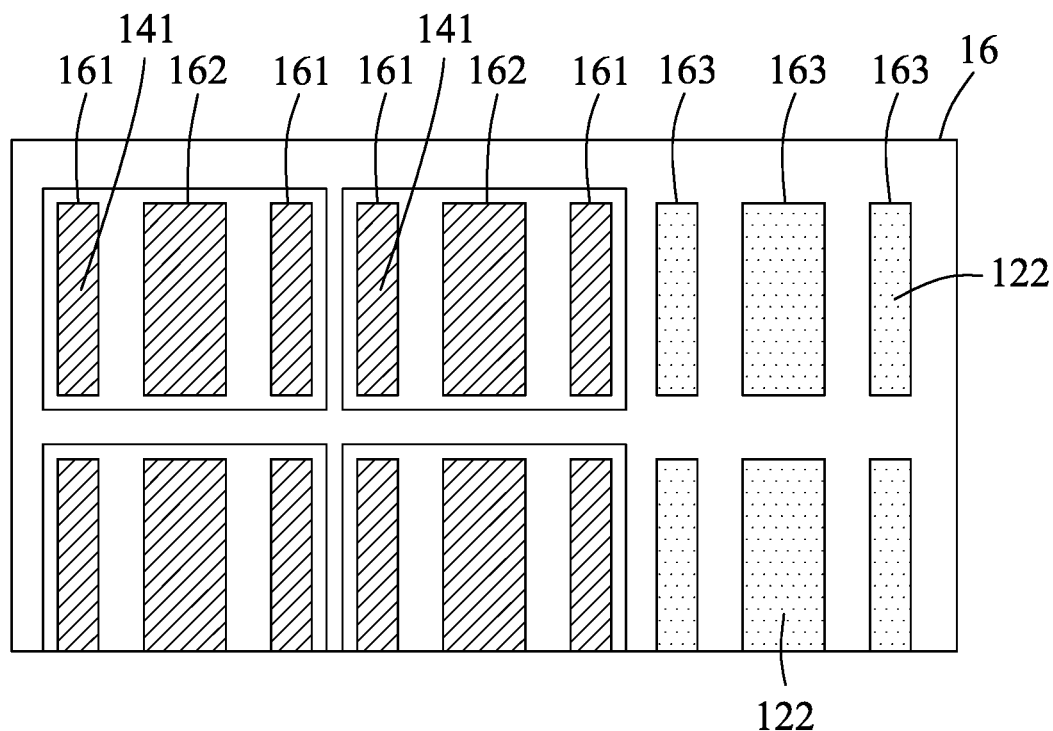

Referring to FIGS. 7, 22 and 23, the method proceeds to step 708, where a patterning process is conducted to pattern the ILD portions 151 obtained in step 706 and the ILD layer 16 formed in step 707 so as to form source trenches 161 and drain trenches 162 for partially exposing the channel portions 141 for the storage cells 61 (see FIG. 6), and to form contact trenches 163 for partially exposing the conductor contacts 122. FIG. 23 is a top view of FIG. 22. In some embodiments, for each of the storage cells 61, two source trenches 161 and one drain trench 162 are formed. The patterning process may be implemented in a manner similar to step 702 described above, and the details thereof are omitted for the sake of brevity.

Figure 24:
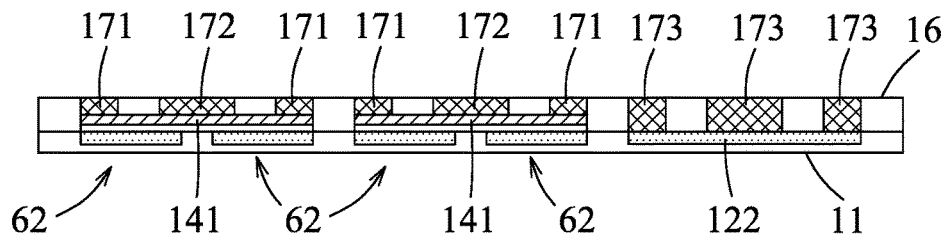
Figure 25:
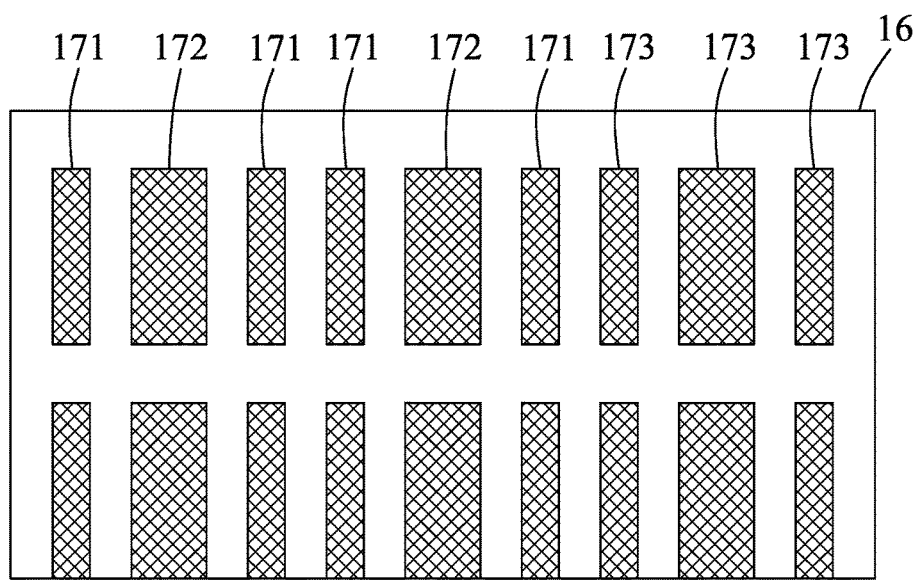

Referring to FIGS. 7, 24 and 25, the method proceeds to step 709, where an electrically conductive layer (not shown) is formed and a planarization process is then conducted, so as to obtain source contacts 171 and drain contacts 172 of back-end transistors 62 for the storage cells 61 (see FIG. 6) and to obtain conductor contacts 173 extending from the exposed portions of the conductor contacts 122 shown in FIGS. 22 and 23. In some embodiments, top surfaces of the source contacts 171, the drain contacts 172 and the conductor contacts 173 may be coplanar with each other. The conductor contacts 173 may be referred to as upper conductor contacts, while the conductor contacts 122 may be referred to as lower conductor contacts. FIG. 25 is a top view of FIG. 24. It is noted that in some embodiments, each of the storage cells 61 includes two back-end transistors 62 that have a common drain contact and two sources contacts. However, in other embodiments, the two back-end transistors of each storage cell may have a common source contact and two drain contacts. The electrically conductive layer is formed over the patterned ILD layer 16 to fill the source trenches 161, the drain trenches 162 and the contact trenches 163 shown in FIGS. 22 and 23. The planarization process is conducted to remove the excess of the electrically conductive layer, the patterned ILD portions 151 and the patterned ILD layer 16, so as to obtain the source contacts 171 in the source trenches 161, the drain contacts 172 in the drain trenches 162 and the conductor contacts 173 in the contact trenches 163. In some embodiments, the source contacts 171 and the drain contact 172 for the two back-end transistors 62 of each storage cell 61 are disposed on a corresponding one of the channel portions 141, and are spaced apart from each other. In some embodiments, for each of the conductor contacts 122, the conductor contact 122 and the conductor contacts 173 formed thereon are in electrical contact with each other, and thus may be deemed as a single contact structure. The materials and the formation for the electrically conductive layer of step 709 are similar to those for the electrically conductive layer 12 described above in step 703, and the details thereof are omitted for the sake of brevity. The planarization process may be implemented using a CMP process or other suitable techniques.

Figure 26:
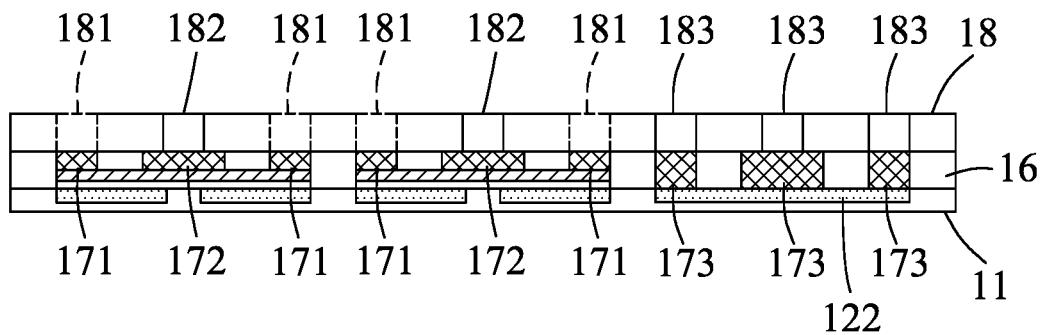
Figure 27:
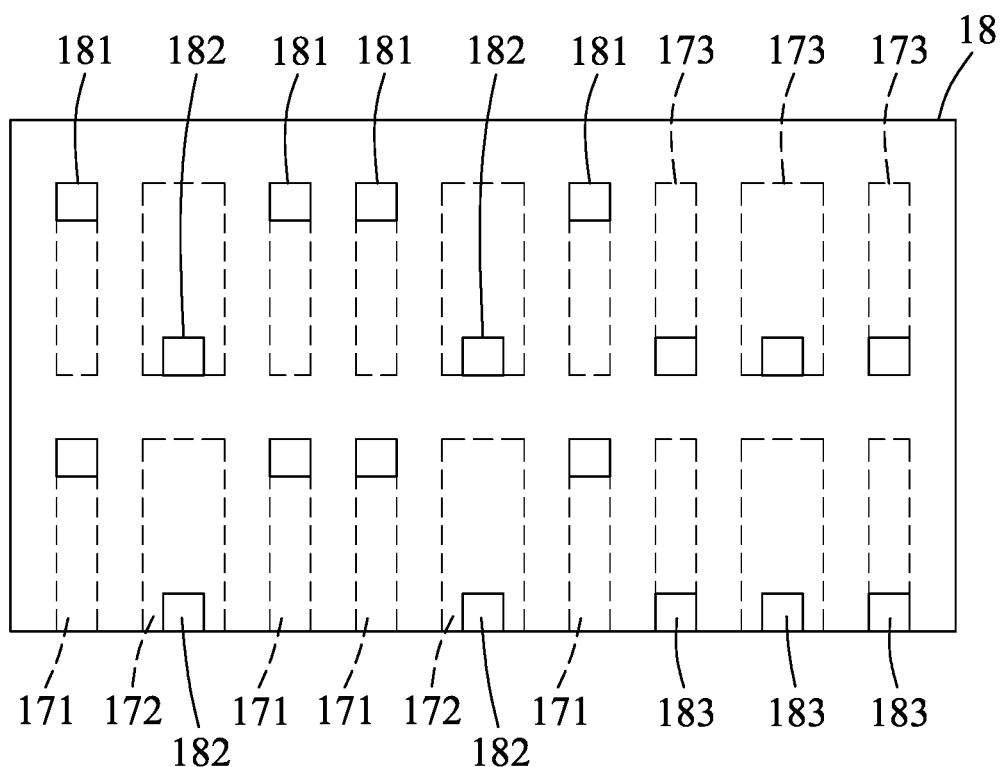

Referring to FIGS. 7, 26 and 27, the method 700 proceeds to step 710, where source vias 181, drain vias 182 and contact vias 183 are formed in an ILD layer 18. FIG. 27 is a top view of FIG. 26. In some embodiments, the source vias 181 are respectively formed on the source contacts 171, the drain vias 182 are respectively formed on the drain contacts 172, and the contact vias 183 are respectively formed on the conductor contacts 173. Top surfaces of the source vias 181, the drain vias 182 and the contact vias 183 may be coplanar with each other. The contact vias 183 and the conductor contacts 173, 122 may cooperate to serve as the bit-line via structure 525 shown in FIGS. 5 and 6. In some embodiments, the source vias 181 are aligned with each other, while the drain vias 182 and the contact vias 183 are aligned with each other. The ILD layer 18 may be formed over the patterned ILD layer 16, the source contacts 171, the drain contacts 172 and the conductor contacts 173. The source vias 181, the drain vias 182 and the contact vias 183 in the ILD layer 18 may be formed using a damascene process, which may include (i) forming trenches in the ILD layer 18 using an etching process, (ii) depositing a via material layer over the ILD layer 18 to fill the trenches, and (iii) conducting a CMP process or other suitable techniques to remove any excess via material layer on the ILD layer 18. The materials and the formation for the ILD layer 18 are similar to those for the ILD layer 11 described in step 701. The materials for the source vias 181, the drain vias 182 and the contact vias 183 may be similar to those for the electrically conductive layer 12 described in step 703.

Figure 28:
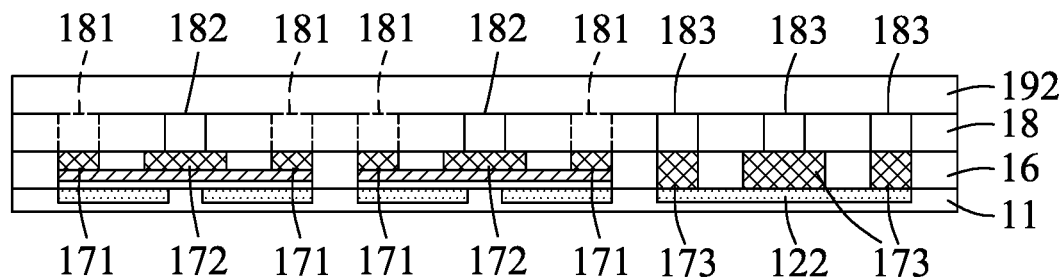
Figure 29:
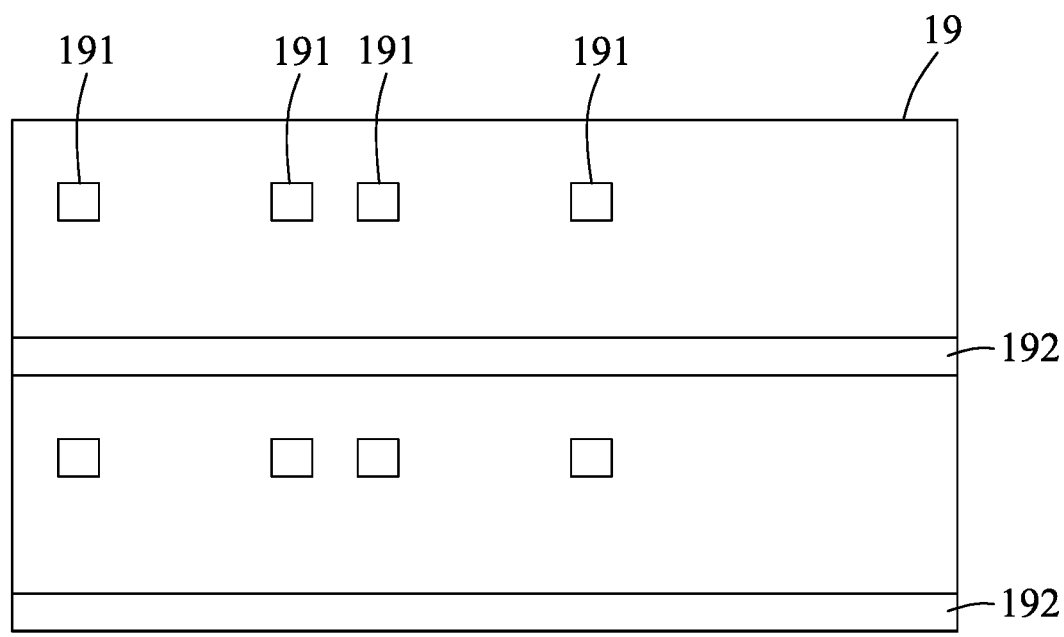

Referring to FIGS. 7, 28 and 29, the method 700 proceeds to step 711, where storage nodes 191 and bit lines 192 are formed in an ILD layer 19. FIG. 29 is a top view of FIG. 28. In some embodiments, the storage nodes 191 are respectively formed on the source vias 181, and each of the bit lines 192 is formed on the drain vias 182 for corresponding ones of the storage cells 61 (see FIG. 6) and the corresponding contact vias 183 that are aligned with each other. Top surfaces of the storage nodes 191 and the bit lines 192 are coplanar with each other. The ILD layer 19 may be formed over the ILD layer 18, the source vias 181, the drain vias 182 and the contact vias 183 formed in step 710. The storage nodes 191 and the bit lines 192 in the ILD layer 19 may be formed using a damascene process which is similar to that described in step 710. The materials and the formation for the ILD layer 19 are similar to those for the ILD layer 11 described in step 701. The materials for the storage nodes 191 and the bit lines 192 may be similar to those for the electrically conductive layer 12 described in step 703. In some embodiments, the contact vias 183 and the conductor contacts 173 and 122, which cooperate to serve as the bit-line via structure 525, may electrically connect the bit lines 192 in the bit-line layer 521 downward to the logic device 51 underneath the memory array 52 as shown in FIGS. 5 and 6. It is noted that in some embodiments, the ILD layer 11 may be formed with contacts (not shown) that electrically connect the bit-line via structure 525 to the routing structure 53 (see FIG. 6) underneath the ILD layer 11. Formation of the contacts in the ILD layer 11 may be implemented using a damascene process which is similar to that described in step 710.

Figure 30:
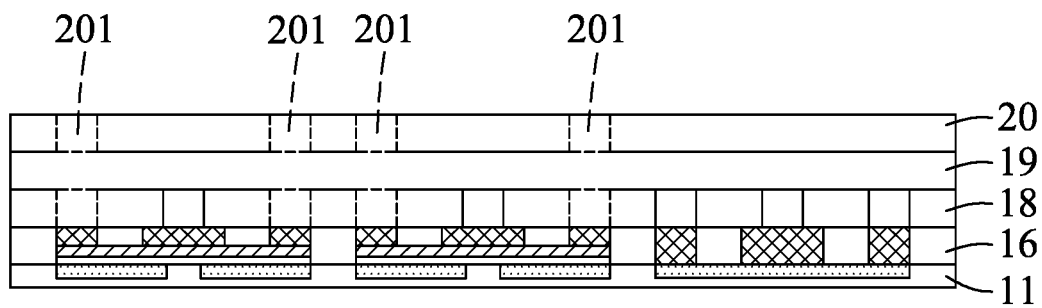
Figure 31:
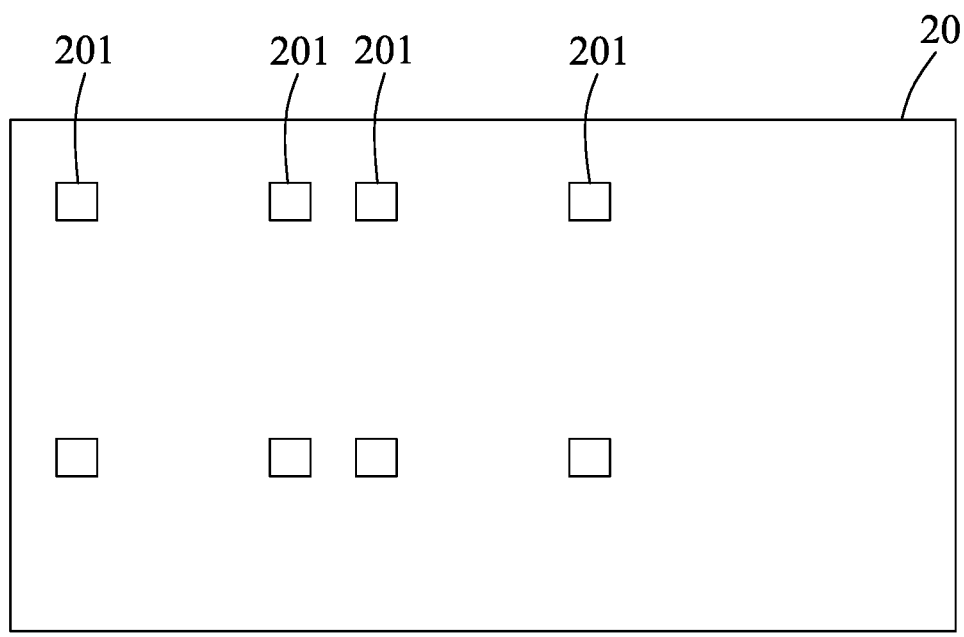

Referring to FIGS. 7, 30 and 31, the method 700 proceeds to step 712, where storage node vias 201 are formed in an ILD layer 20. FIG. 31 is a top view of FIG. 30. In some embodiments, the storage node vias 201 are respectively formed on the storage nodes 191 (see FIG. 29), and are respectively in electrical contact with the storage nodes 191. The ILD layer 20 may be formed over the ILD layer 19, the source nodes 191 and the bit lines 192 formed in step 711. The storage node vias 201 may be formed using a damascene process which is similar to that described in step 710. The materials and the formation for the ILD layer 20 are similar to those for the ILD layer 11 described in step 701. The materials for the storage node vias 201 may be similar to those for the electrically conductive layer 12 described in step 703.

Figure 32:
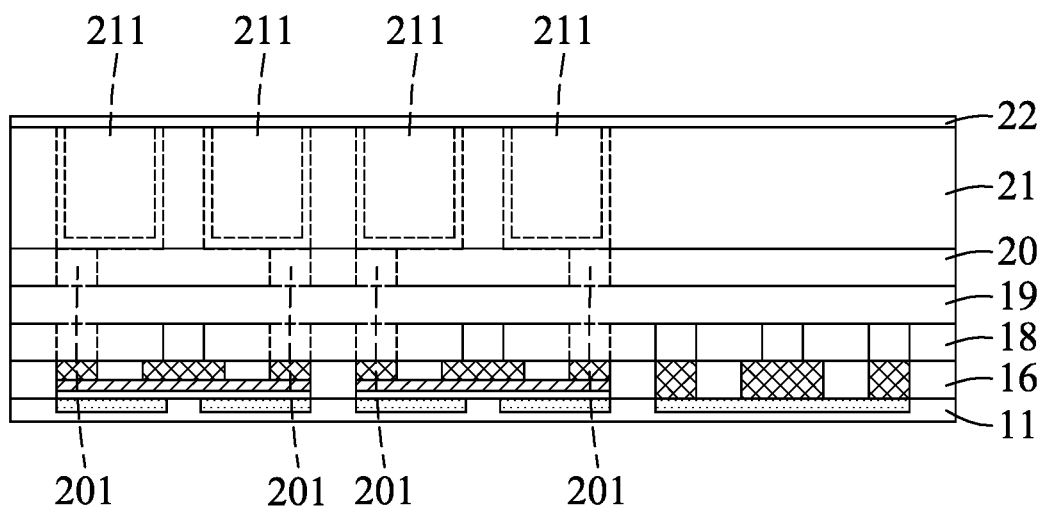
Figure 33:
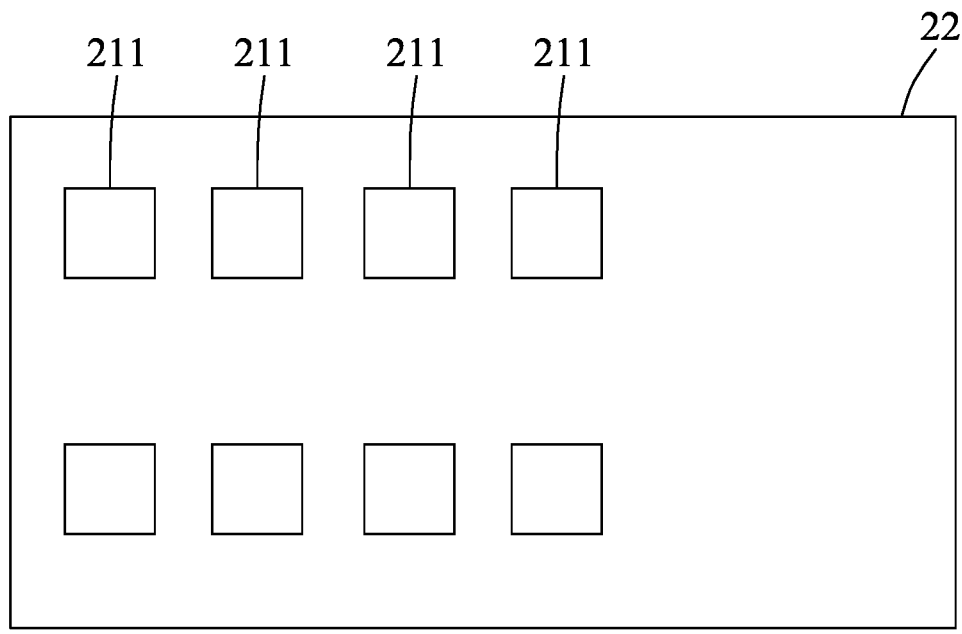

Referring to FIGS. 7, 32 and 33, the method 700 proceeds to step 713, where an ILD layer 21, recesses 211 and a conformal electrically conductive layer 22 are formed in sequence. The ILD layer 21 is formed over the ILD layer 20 and the storage node vias 201 which are formed in step 712. FIG. 33 is a top view of FIG. 32. The recesses 211 are formed in the ILD layer 21 to expose the storage node vias 201. The conformal electrically conductive layer 22 is formed over the ILD layer 21 and along inner recess surfaces of the recesses 211 such that the conformal electrically conductive layer 22 is in electrical contact with the storage node vias 201. The materials and the formation for the ILD layer 21 are similar to those for the ILD layer 11 described in step 701. The recesses 211 may be formed using a photolithography process and an etching process similar to those described in step 702. The materials for the conformal electrically conductive layer 22 may be similar to those for the electrically conductive layer 12 described in step 703. The conformal electrically conductive layer 22 may be formed using CVD, high density plasma CVD (HDPCVD), sub-atmospheric CVD (SACVD), molecular layer deposition (MLD), PVD, sputtering, epitaxial growth, or other suitable techniques.

Figure 34:
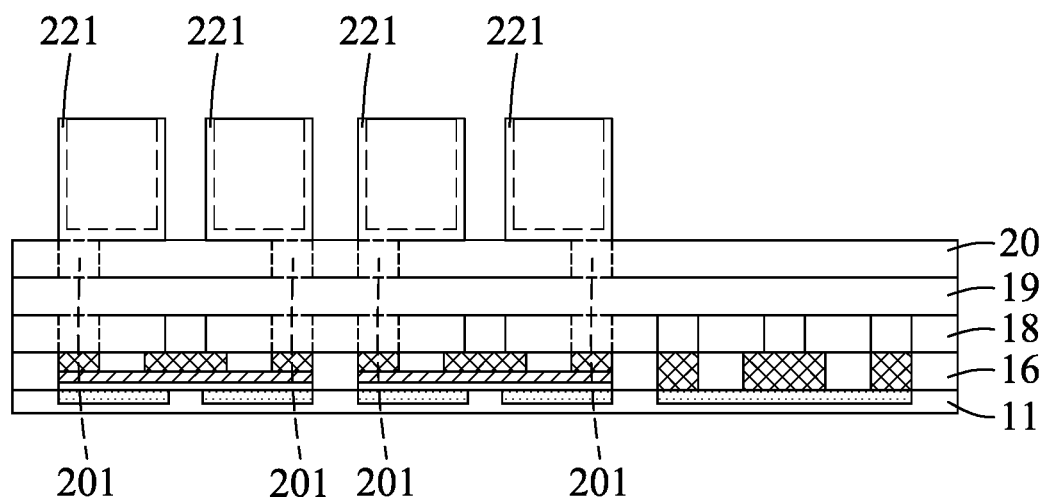
Figure 35:
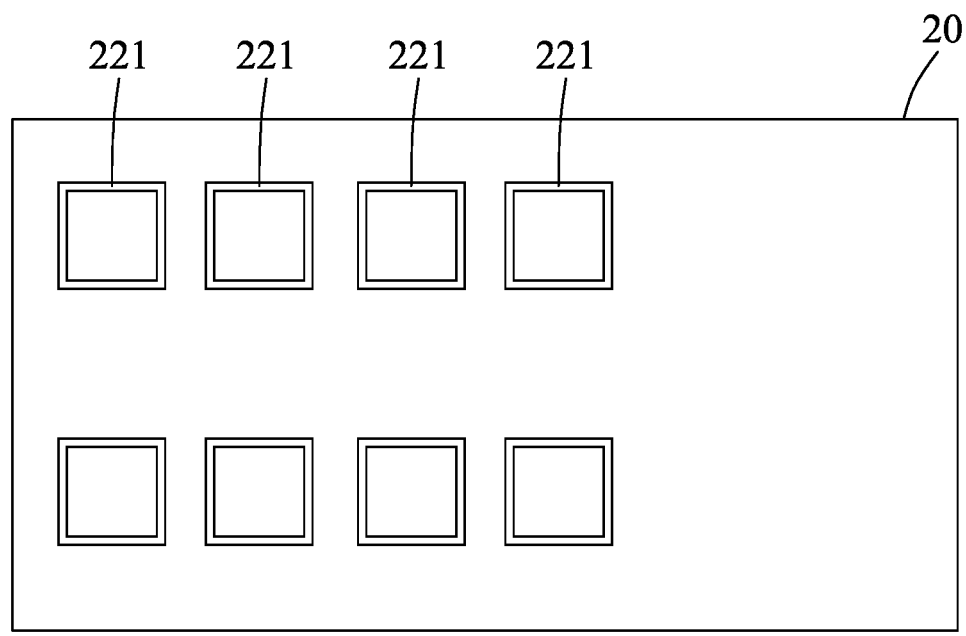

Referring to FIGS. 7, 34 and 35, the method 700 proceeds to step 714, where a planarization process and an etching process are conducted to form bottom electrodes 221 for capacitors, such as the capacitors 63 shown in FIG. 6. FIG. 35 is a top view of FIG. 34. The planarization process is conducted to remove the excess of the conformal electrically conductive layer 22 on the ILD layer 21 (see FIG. 32) such that the ILD layer 21 formed in step 713 may be exposed. The planarization process may be implemented using a CMP process or other suitable techniques. The etching process is conducted to remove the ILD layer 21 formed in step 713 and exposed after the planarization process. The etching process may be similar to that described in step 702. In some embodiments, each of the bottom electrodes 221 is electrically connected to a respective one of the storage node vias 201 formed in step 712.

Figure 36:
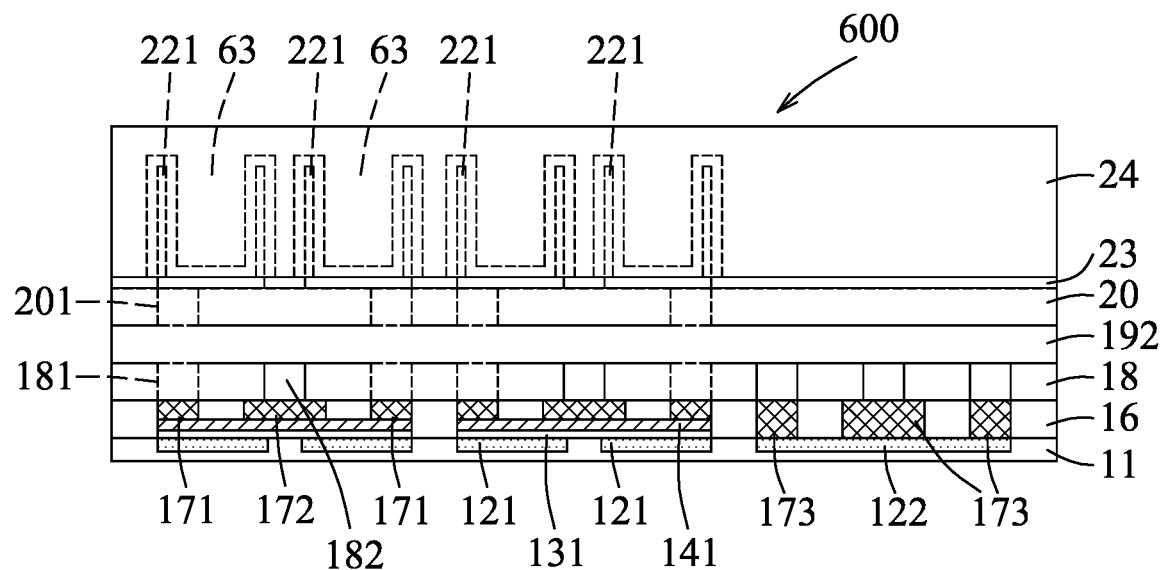
Figure 37:

Referring to FIGS. 7, 36 and 37, the method 700 proceeds to step 715, where a capacitance dielectric layer 23 is conformally formed over the structure shown in FIGS. 34 and 35 and an electrically conductive layer 24 is formed over the capacitance dielectric layer 23 to serve as top electrodes for the capacitors, such as the capacitors 63 shown in FIG. 6. The capacitance dielectric layer 23 is formed over the bottom electrodes 221 and the ILD layer 20. The materials and the formation for the capacitance dielectric layer 23 are similar to those for the gate dielectric layer 13 described in step 705. The materials and the formation for the electrically conductive layer 24 are similar to those for the electrically conductive layer 12 described in step 703. In some embodiments, the bottom electrodes 221, the capacitance dielectric layer 23 and the top electrodes may cooperatively serve as the capacitors 63 included in the capacitance layer 522 shown in FIGS. 5 and 6. In some embodiments, each of the capacitors 63 may be electrically connected to a respective one of the source contacts 171 through the corresponding source via 181, the corresponding storage node 191 (see FIG. 29), and the corresponding storage node via 201.

It is noted that the formation of the bit-line via structure 525 (see FIGS. 5 and 6) may be implemented by the same steps for forming the back-end transistors 62, the source vias 181 and the drain vias 182 in the storage cells 61 (e.g., steps 701 to 710) except that the gate dielectric layer 13, the channel material layer 14 and the ILD layer 15 above the conductor contacts 122 are removed in step 706 (see FIG. 18). In other words, during formation of the storage cells 61, the bit-line via structure 525 may be simultaneously formed to one side of the storage cells 61, and thus extra processes for separately forming the bit-line via structure 525 may not be necessary.

Figure 38:
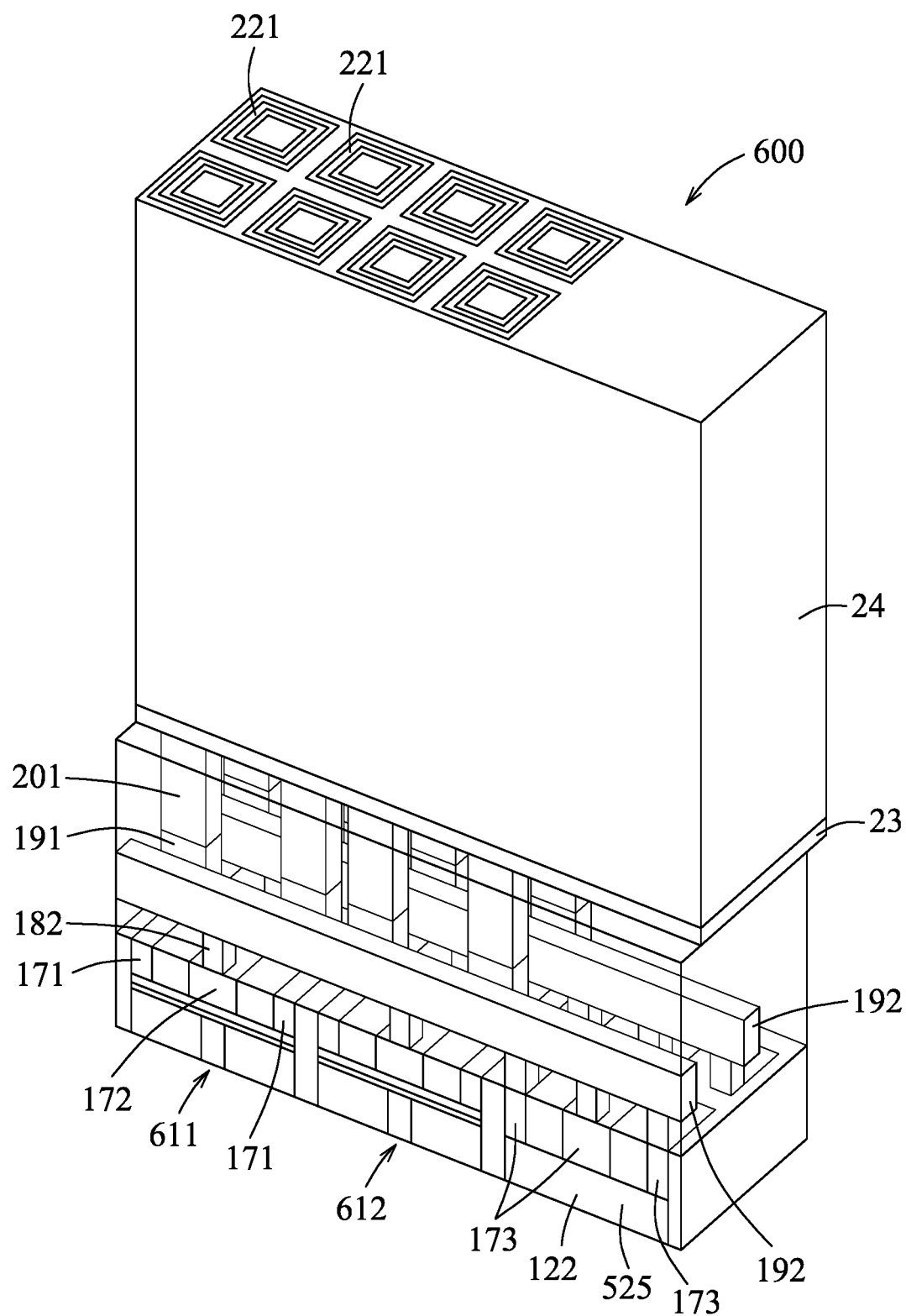
FIG. 38 is a perspective cross-sectional view of a semiconductor device in accordance with some embodiments.

FIG. 38 illustrates a perspective cross-sectional view of a semiconductor device in accordance with some embodiments, where the semiconductor device may be manufactured using the method 700 illustrated in FIG. 7, and may be embodied in the memory array 52 as shown in FIG. 5. The semiconductor device may include storage cells and a bit-line via structure 525. The storage cells may be divided into active cells 611 (only one is depicted) and dummy cells 612 (only one is depicted). The bit-line via structure 525 may connect the bit lines 192 to a periphery device (not shown) underneath the semiconductor device.

In alternative embodiments, other suitable methods may also be applied for forming the semiconductor device 600 shown in FIGS. 6, 36 and 38. In other alternative embodiments, additional features may be added to the semiconductor device 600 shown in FIGS. 6, 36 and 38, and some features in the semiconductor device 600 shown in FIGS. 6, 36 and 38 may be modified, replaced, or eliminated without departure from the spirit and scope of the present disclosure.

FIGS. 39 to 44 illustrate schematic views of the intermediate stages corresponding to steps 702 to 704 of the method 700 in alternative embodiments. Since the intermediate stages corresponding to the other steps of the method 700 may be kept unchanged, descriptions regarding details of these other steps are omitted herein for the sake of brevity.

Figure 39:
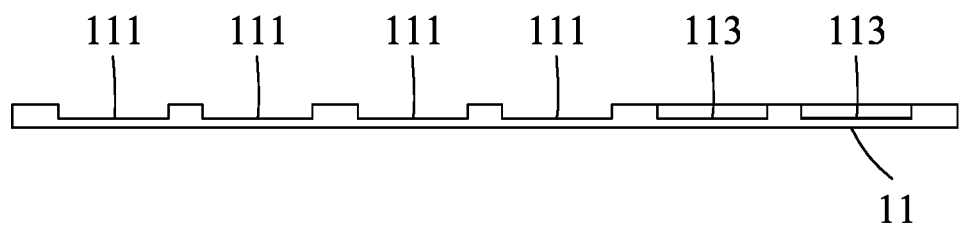
FIGS. 39 to 44 are schematic views illustrating intermediate stages corresponding to steps 702 to 704 of the method as depicted in FIG. 7 in accordance with some alternative embodiments.
Figure 40:
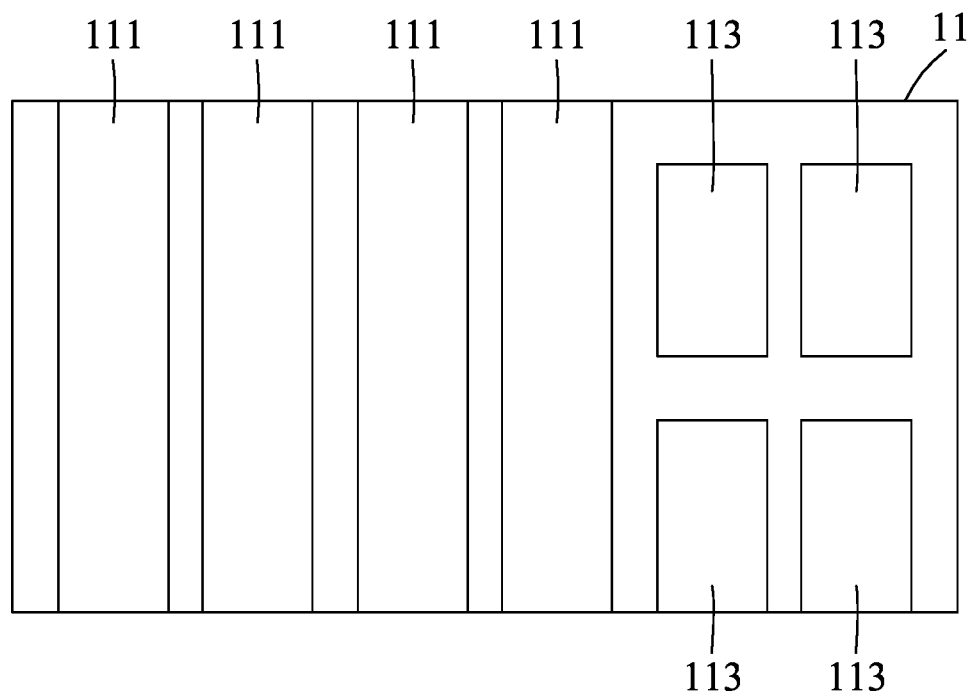

Referring to FIGS. 39 and 40, step 702 is performed where a patterning process is conducted to pattern the ILD layer 11 shown in FIGS. 8 and 9 so as to form bottom gate trenches 111 and contact trenches 113 in the ILD layer 11. In comparison with the contact trenches 112 formed as shown in FIGS. 10 and 11, the number of the contact trenches 113 formed as shown in FIGS. 39 and 40 is twice that of the contact trenches 112 in FIGS. 10 and 11. In other words, each of the contact trenches 112 in FIGS. 10 and 11 is divided into two contact trenches 113 in FIGS. 39 and 40. In the example depicted in FIGS. 39 and 40, it is exemplified that there are four bottom gate trenches 111 and four contact trenches 113 in the ILD layer 11.

Figure 41:
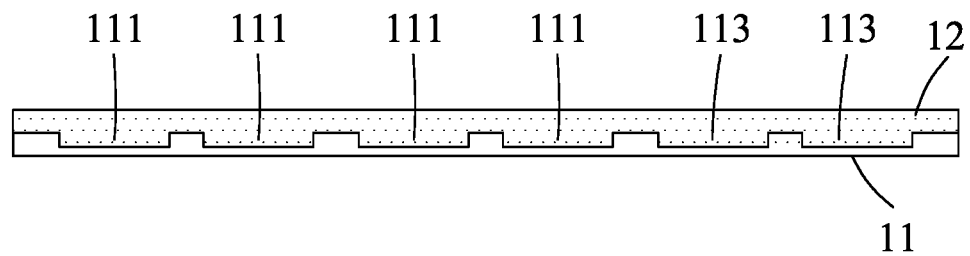
Figure 42:
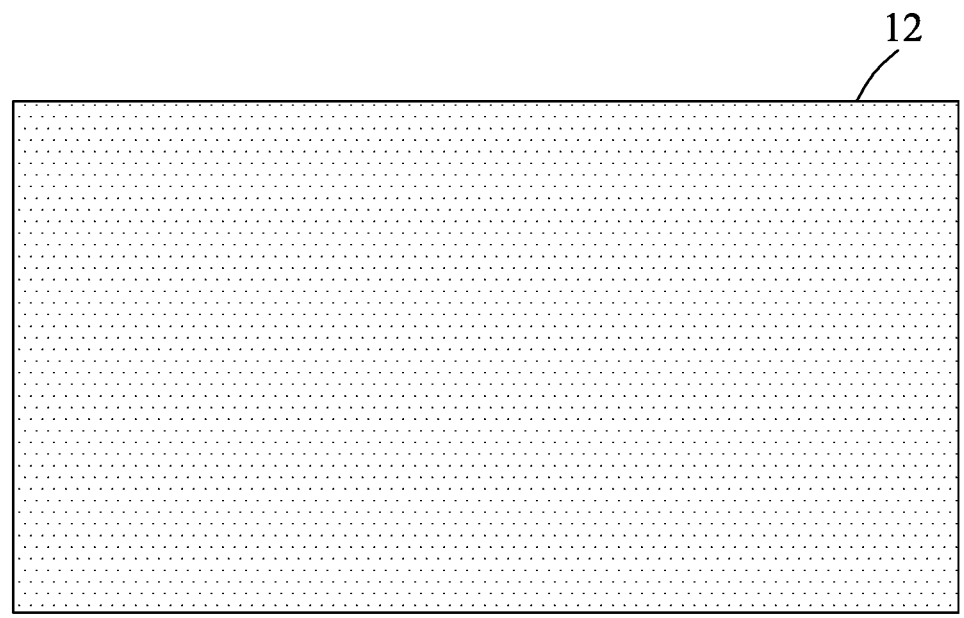

Referring to FIGS. 41 and 42, step 703 is performed where an electrically conductive layer 12 is formed on the ILD layer 11 and fills the bottom gate trenches 111 and the contact trenches 113.

Figure 43:
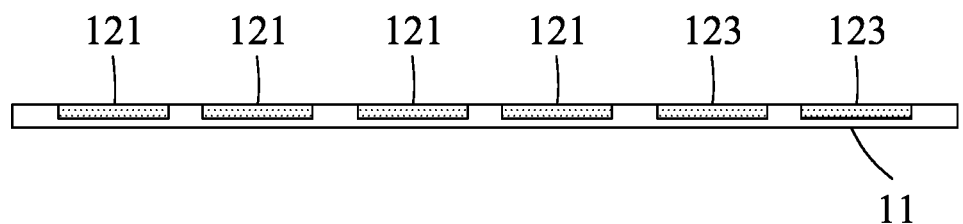
Figure 44:
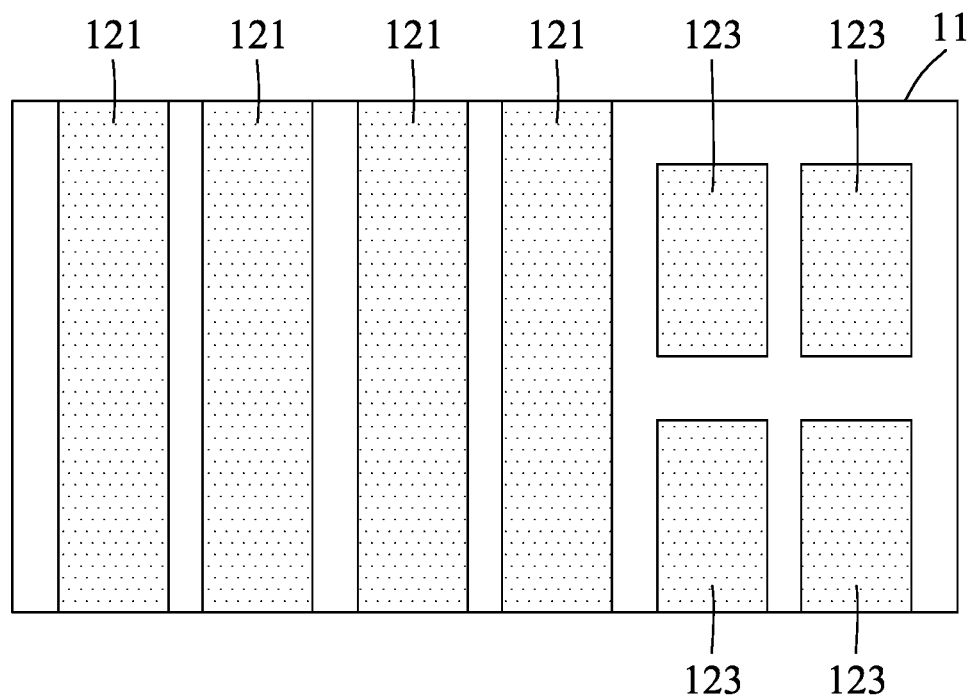

Referring to FIGS. 43 and 44, step 704 is performed where a planarization process is conducted to remove the excess of the electrically conductive layer 12 on the ILD layer 11 outside the bottom gate trenches 111 and the contact trenches 113 shown in FIGS. 41 and 42, so as to obtain four gate electrodes 121 and four conductor contacts 123. The gate electrodes 121 and the conductor contacts 123 are formed in the ILD layer 11, and are spaced apart from each other. In comparison with the conductor contacts 122 formed as shown in FIGS. 14 and 15, the number of the conductor contacts 123 formed as shown in FIGS. 43 and 44 is twice as much. In other words, each of the conductor contacts 122 in FIGS. 14 and 15 is divided into two conductor contacts 123 in FIGS. 43 and 44, so a width of an individual one of the conductor contacts 123 may be identical to that of an individual one of the gate electrodes 121. Accordingly, an effect of uniform line width may be achieved and the pattern density may be maintained.

FIGS. 45 to 48 illustrate schematic views of the intermediate stages corresponding to steps 702, 704, 706 and 708 of the method 700 in alternative embodiments. Since the intermediate stages corresponding to the other steps of the method 700 may be kept unchanged, descriptions regarding details of these other steps are omitted herein for the sake of brevity.

Figure 45:
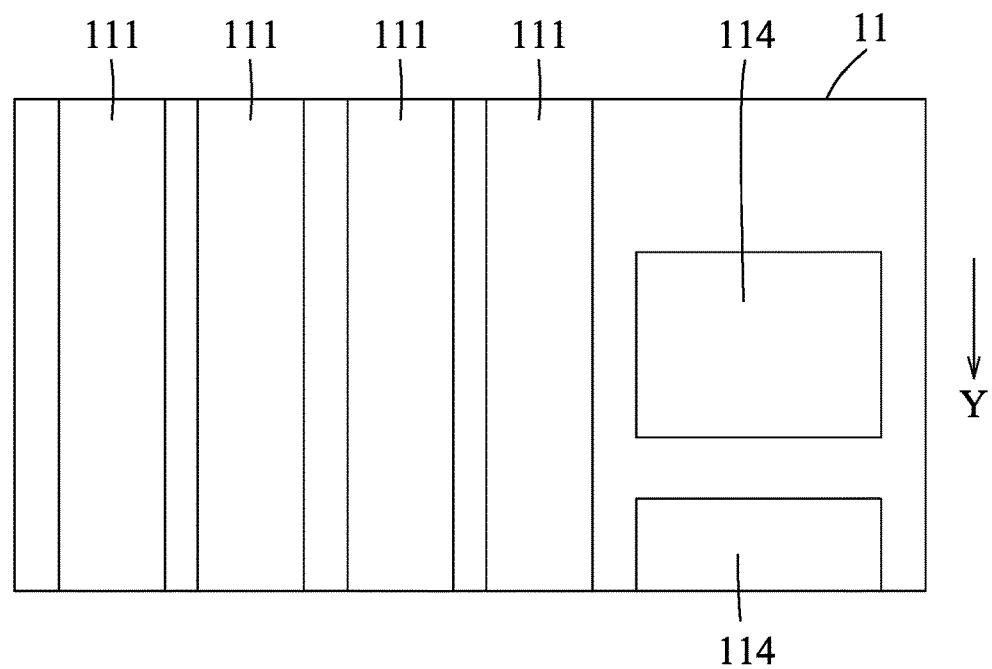
FIGS. 45 to 48 are schematic views illustrating intermediate stages corresponding to steps 702, 704, 706 and 708 of the method as depicted in FIG. 7 in accordance with some alternative embodiments.

Referring to FIG. 45, step 702 is performed where a patterning process is conducted to pattern the ILD layer 11 shown in FIG. 9 so as to form bottom gate trenches 111 and contact trenches 114 in the ILD layer 11. In comparison with the contact trenches 112 formed as shown in FIG. 11, positions of the contact trenches 114 formed as shown in FIG. 45 are shifted in a Y-axis direction. In the example depicted in FIG. 45, it is exemplified that there are four bottom gate trenches 111 and two contact trenches 114 in the ILD layer 11.

Figure 46:
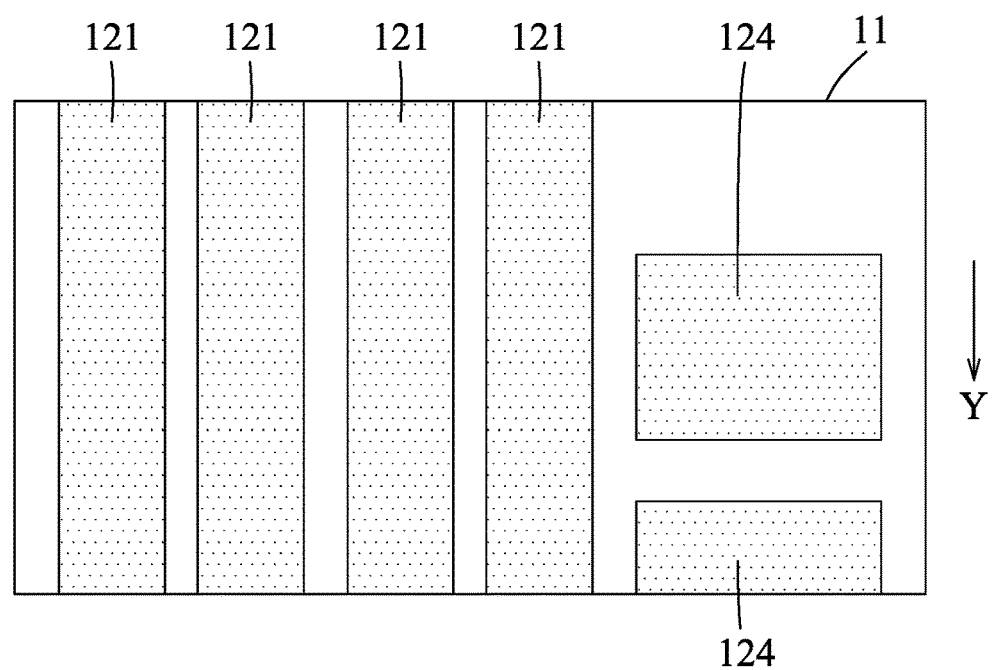

Referring to FIG. 46, step 704 is performed where a planarization process is conducted to remove the excess of the electrically conductive layer 12 on the ILD layer 11 outside the bottom gate trenches 111 and the contact trenches 114, so as to obtain four gate electrodes 121 and two conductor contacts 124. In comparison with the conductor contacts 122 formed as shown in FIG. 15, positions of the conductor contacts 124 formed as shown in FIG. 46 are shifted in the Y-axis direction.

Figure 47:
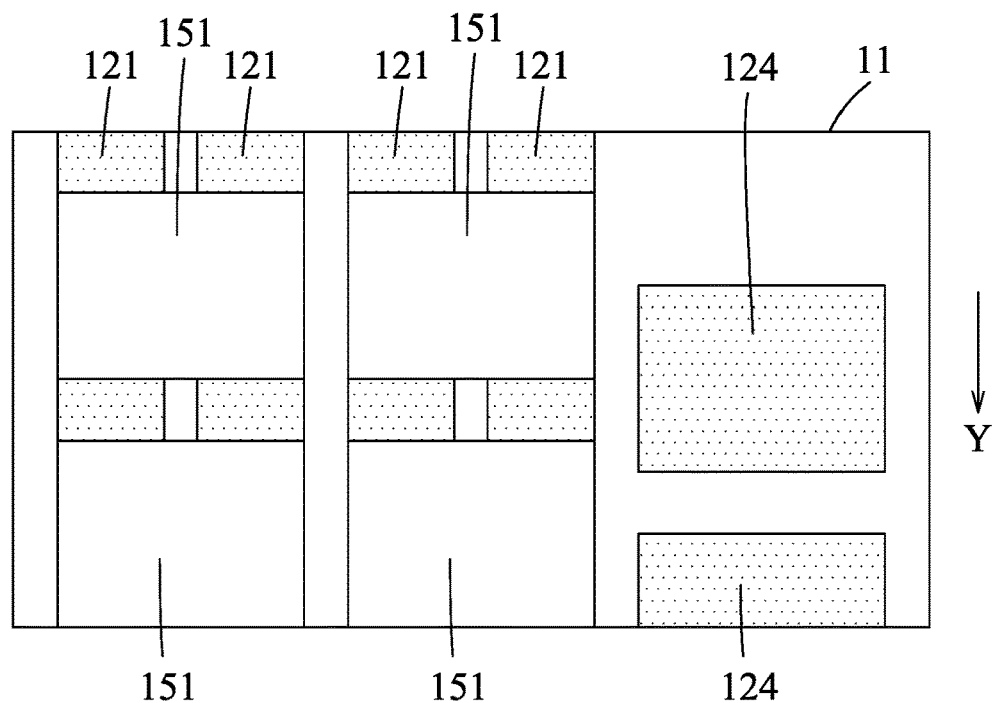

Referring to FIG. 47, step 706 is performed where a patterning process is conducted to pattern the gate dielectric layer 13, the channel material layer 14 and the ILD layer 15 shown in FIG. 16, so as to define positions of storage cells 61 for the memory array 52 (see FIGS. 5 and 6) and to remove the gate dielectric layer 13, the channel material layer 14 and the ILD layer 15 above the conductor contacts 124 to expose the conductor contacts 124. In comparison with the conductor contacts 122 exposed as shown in FIG. 19, positions of the conductor contacts 124 exposed as shown in FIG. 47 are shifted in the Y-axis direction, such that the conductor contacts 124 are not aligned with the positions of the storage cells. After step 706, (i) the gate dielectric layer 13 is patterned into gate dielectrics portions 131 (see FIG. 18) each of which is formed over two adjacent ones of the gate electrodes 121 for a corresponding one of the storage cells 61, (ii) the channel material layer 14 is patterned into channel portions 141 each of which is formed over a corresponding one of the gate dielectric portions 131, and (iii) the ILD layer 15 is patterned to form ILD portions 151 each of which is formed over a corresponding one of the channel portions 141.

Figure 48:
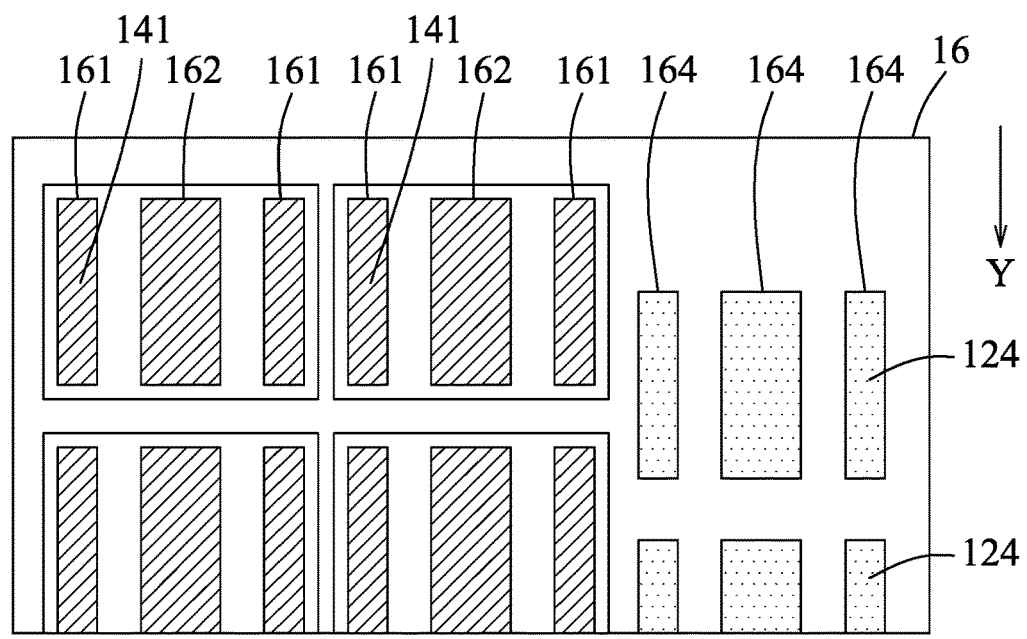

Referring to FIG. 48, step 708 is performed where a patterning process is conducted to pattern the ILD portions 151 and the ILD layer 16 so as to form source trenches 161 and drain trenches 162 for partially exposing the channel portions 141 for the storage cells, and to form contact trenches 164 for partially exposing the conductor contacts 124. In comparison with the contact trenches 163 formed as shown in FIG. 23, positions of the contact trenches 164 formed as shown in FIG. 48 are shifted in the Y-axis direction, such that the contact trenches 164 are not aligned with the source trenches 161 and the drain trenches 162. In this way, after the conductor contacts (not shown) are formed in the contact trenches 164 in step 709, in step 710, the contact vias 183 may be respectively formed at middle positions of the not-shown conductor contacts, rather than edge positions of the conductor contacts 172 (see FIG. 27). As a result, via landing windows for forming the contact vias 183 on the conductor contacts in the Y-axis direction may be enlarged, facilitating registration of the contact vias 183 onto the conductor contacts.

Figure 49:
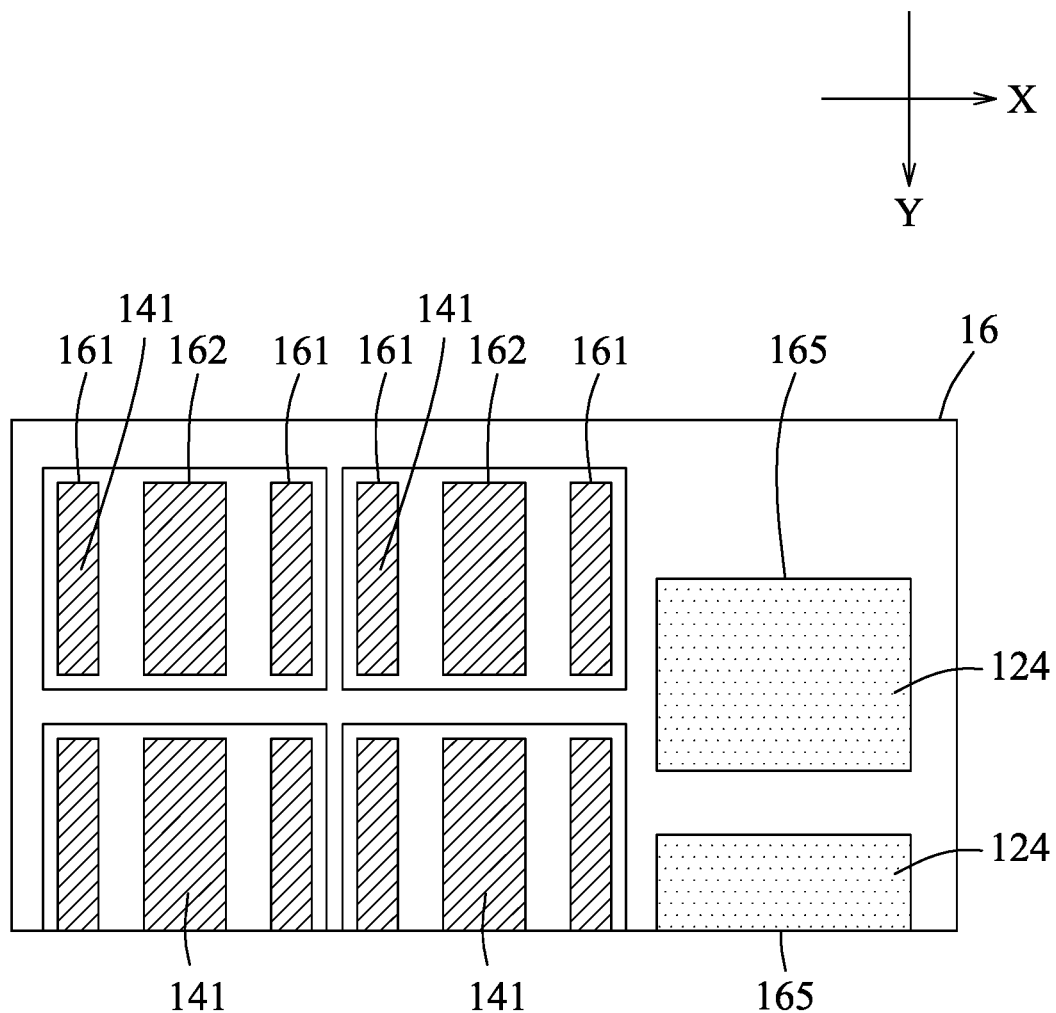
FIG. 49 illustrates a schematic view of the intermediate stage corresponding to step 708 of the method as depicted in FIG. 7 in accordance with some alternative embodiments.

FIG. 49 illustrate a schematic view of the intermediate stage corresponding to step 708 of the method 700 in alternative embodiments. The patterning process performed as shown in FIG. 49 is similar to that of FIG. 48, and the differences reside in that shapes of the contact trenches 165 are different from those of the contact trenches 164 shown in FIG. 48. Specifically, the contact trenches 165 are formed in such a way that the whole of the conductor contacts 124 obtained in step 704 is exposed. In this way, a pattern of the conductor contacts (not shown) which are to be formed in the contact trenches 165 in step 709 may be enlarged. As a result, in step 710, via landing windows for forming the contact vias 183 on the conductor contacts in both an X-axis direction and the Y-axis direction may be enlarged as compared with those shown in FIG. 27, further facilitating registration of the contact vias 183 onto the conductor contacts. In addition, since areas of the conductor contacts are increased, overall resistance of the bit-line via structure 525 may be reduced.

In this disclosure, the integrated circuit includes at least one logic device in the FEOL and a memory array in the BEOL, and thus the memory array may be embedded within the logic device. As such, extra processes are not required to combine the memory array and the logic device together during chip packaging, saving manufacturing cost and reducing chip size. In addition, the fabrication processes of the memory array, which includes unique back-end transistors different from transistors of the logic device in the FEOL, are all implemented in the BEOL, so a CuA (CMOS under array) scheme may be realized. Furthermore, the bit-line via structure is formed using similar fabrication processes for forming the back-end transistors, and may be formed in a portion of the transistor layer that belongs to a region allocated for dummy cells. Therefore, the memory array may be electrically connected to a peripheral device (e.g., the logic device) through a built-in connection mechanism (i.e., the bit-line via structure), increasing operating speed of the integrated circuit.

In accordance with some embodiments of the present disclosure, a semiconductor device includes a transistor, a bit line and a bit-line via structure. The transistor is located in a transistor layer, and has a source contact and a drain contact. The bit line is electrically connected to one of the source contact and the drain contact. The bit-line via structure is located in the transistor layer, and electrically interconnects the bit line and a periphery device.

In accordance with some embodiments of the present disclosure, the bit-line via structure includes a lower conductor contact, and the transistor further includes a gate electrode. A top surface of the conductor contact is coplanar with a top surface of the gate electrode.

In accordance with some embodiments of the present disclosure, the lower conductor contact includes an electrically conductive material identical to that included in the gate electrode.

In accordance with some embodiments of the present disclosure, the bit-line via structure includes an upper conductor contact disposed on the lower conductor contact. The transistor further includes a gate dielectric portion disposed on the gate electrode, and a channel portion disposed on the gate dielectric portion. The source contact and the drain contact are disposed on the channel portion. Top surfaces of the source contact, the drain contact and the upper conductor contact are coplanar with each other.

In accordance with some embodiments of the present disclosure, the upper conductor contact includes an electrically conductive material identical to that included in the source contact and the drain contact.

In accordance with some embodiments of the present disclosure, the semiconductor device further includes a storage node which is electrically connected to the other one of the source contact and the drain contact.

In accordance with some embodiments of the present disclosure, the bit line is electrically connected to the drain contact, and the storage node is electrically connected to the source contact.

In accordance with some embodiments of the present disclosure, the semiconductor device further includes a source via and a drain via which are respectively disposed on the source contact and the drain contact of the transistor. The bit line is electrically connected to the drain contact through the drain via. The storage node is electrically connected to the source contact through the source via. The bit-line via structure further includes a contact via disposed to electrically connect the upper conductor contact to the bit line. Top surfaces of the source via, the drain via and the contact via are coplanar with each other.

In accordance with some embodiments of the present disclosure, top surfaces of the storage node and the bit line are coplanar with each other.

In accordance with some embodiments of the present disclosure, the semiconductor device is a back-end-of-line device.

In accordance with some embodiments of the present disclosure, an integrated circuit includes a logic device and a memory array. The logic device is located in a front-end-of-line (FEOL). The memory array is located in a back-end-of-line (BEOL) and above the logic device. The memory array includes a bit-line via structure through which the memory array is electrically connected to the logic device.

In accordance with some embodiments of the present disclosure, the integrated circuit further includes a routing structure located between the memory array and the logic device to electrically connect the bit-line via structure to the logic device.

In accordance with some embodiments of the present disclosure, the memory array further includes a back-end transistor, and a bit line that electrically interconnects the back-end transistor and the bit-line via structure.

In accordance with some embodiments of the present disclosure, the memory array further includes a transistor layer including a plurality of back-end transistors. The bit-line via structure is formed in the transistor layer.

In accordance with some embodiments of the present disclosure, the memory array further includes a bit-line layer including a bit line, and a capacitance layer above the bit-line layer. The capacitance layer includes a plurality of capacitors electrically and respectively connected to the back-end transistors in the transistor layer.

In accordance with some embodiments of the present disclosure, a method for manufacturing a semiconductor device includes forming a gate electrode and a lower conductor contact which has a top surface coplanar with that of the gate electrode; forming a gate dielectric portion and a channel portion in a second ILD layer on the first ILD layer, the gate dielectric portion being disposed between the channel portion and the gate electrode; and forming a source contact and a drain contact which are spaced apart from each other and which are in electrical contact with the channel portion, and an upper conductor contact which is in electrical contact with the lower conductor contact. Top surfaces of the source contact, the drain contact, and the upper conductor contact are coplanar with each other.

In accordance with some embodiments of the present disclosure, the method further includes forming a source via over the source contact to be in electrical contact with the source contact, a drain via over the drain contact to be in electrical contact with the drain contact, and a contact via over the upper conductor contact to be in electrical contact with the upper conductor contact. Top surfaces of the source via, the drain via and the contact via are coplanar with each other.

In accordance with some embodiments of the present disclosure, the method further includes forming a storage node over the source via to be in electrical contact with the source via, and a bit line over the drain via and the contact via to be in electrical contact with the drain via and the contact via. Top surfaces of the source node and the bit line are coplanar with each other.

In accordance with some embodiments of the present disclosure, the method further includes forming a storage node via over the storage node to be in electrical contact with the storage node.

In accordance with some embodiments of the present disclosure, the method further includes forming a bottom electrode over the storage node via to be in electrical contact with the storage node via; forming a capacitance dielectric layer over the bottom electrode; and forming a top electrode over the capacitance dielectric layer, where the bottom electrode, the capacitance dielectric layer and the top electrode serve as a capacitor.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a transistor located in a transistor layer, and having a source contact and a drain contact;
   a bit line electrically connected to one of the source contact and the drain contact; and
   a bit-line via structure located in the transistor layer, and electrically interconnecting the bit line and a periphery device;
   wherein the bit-line via structure includes a lower conductor contact, and the transistor further includes a gate electrode, a top surface of the lower conductor contact being coplanar with a top surface of the gate electrode.

2. The semiconductor device of claim 1, wherein the lower conductor contact includes an electrically conductive material identical to that included in the gate electrode.

3. The semiconductor device of claim 1, which is a back-end-of-line device.

4. The semiconductor device of claim 1, wherein
   the bit-line via structure includes an upper conductor contact disposed on the lower conductor contact,
   the transistor further includes a gate dielectric portion disposed on the gate electrode, and a channel portion disposed on the gate dielectric portion,
   the source contact and the drain contact are disposed on the channel portion, and
   top surfaces of the source contact, the drain contact and the upper conductor contact are coplanar with each other.

5. The semiconductor device of claim 4, wherein the upper conductor contact includes an electrically conductive material identical to that included in the source contact and the drain contact.

6. The semiconductor device of claim 4, further comprising a storage node which is electrically connected to the other one of the source contact and the drain contact.

7. The semiconductor device of claim 6, wherein the bit line is electrically connected to the drain contact, and the storage node is electrically connected to the source contact.

8. The semiconductor device of claim 7, further comprising a source via and a drain via which are respectively disposed on the source contact and the drain contact of the transistor,
   the bit line being electrically connected to the drain contact through the drain via,
   the storage node being electrically connected to the source contact through the source via,
   the bit-line via structure further including a contact via disposed to electrically connect the upper conductor contact to the bit line,
   top surfaces of the source via, the drain via and the contact via being coplanar with each other.

9. The semiconductor device of claim 8, wherein top surfaces of the storage node and the bit line are coplanar with each other.

10. The semiconductor device of claim 7, further comprising a storage node via that is formed on the storage node and that is in electrical contact with the storage node.

11. The semiconductor device of claim 10, further comprising a capacitor that is electrically connected to the source contact through the source via, the storage node and the storage node via.

12. An integrated circuit comprising:
    a logic device located in a front-end-of-line (FEOL); and
    a memory array located in a back-end-of-line (BEOL) and above the logic device,
    the memory array including a bit-line via structure through which the memory array is electrically connected to the logic device;
    wherein the memory array further includes a transistor layer including a plurality of back-end transistors, the bit-line via structure being formed in the transistor layer;
    wherein the memory array further includes a bit-line layer including a bit line, and a capacitance layer above the bit-line layer, the capacitance layer including a plurality of capacitors electrically and respectively connected to the back-end transistors in the transistor layer.

13. The semiconductor device of claim 12, wherein the bit-line layer is stacked on the transistor layer, and the capacitance layer is stacked on the bit-line layer.

14. The integrated circuit of claim 12, further comprising a routing structure located between the memory array and the logic device to electrically connect the bit-line via structure to the logic device.

15. The integrated circuit of claim 14, wherein the bit line electrically interconnects the back-end transistors and the bit-line via structure.

16. A method for manufacturing a semiconductor device, comprising:
    forming a gate electrode and a lower conductor contact which has a top surface coplanar with that of the gate electrode;

forming a gate dielectric portion and a channel portion over the gate electrode, the gate dielectric portion being disposed between the channel portion and the gate electrode; and forming a source contact and a drain contact which are spaced apart from each other and which are in electrical contact with the channel portion, and an upper conductor contact which is in electrical contact with the lower conductor contact, top surfaces of the source contact, the drain contact, and the upper conductor contact being coplanar with each other.

17. The method of claim 16, further comprising:

forming a source via over the source contact to be in electrical contact with the source contact, a drain via over the drain contact to be in electrical contact with the drain contact, and a contact via over the upper conductor contact to be in electrical contact with the upper conductor contact, top surfaces of the source via, the drain via and the contact via being coplanar with each other.

18. The method of claim 17, further comprising:

forming a storage node over the source via to be in electrical contact with the source via, and a bit line over the drain via and the contact via to be in electrical contact with the drain via and the contact via, top surfaces of the source node and the bit line being coplanar with each other.

19. The method of claim 18, further comprising:

forming a storage node via over the storage node to be in electrical contact with the storage node.

20. The method of claim 19, further comprising:

forming a bottom electrode over the storage node via to be in electrical contact with the storage node via;

forming a capacitance dielectric layer over the bottom electrode; and forming a top electrode over the capacitance dielectric layer, where the bottom electrode, the capacitance dielectric layer and the top electrode serve as a capacitor.

* * * * *